(12) United States Patent
Kim et al.

(10) Patent No.: US 6,576,053 B1
(45) Date of Patent: Jun. 10, 2003

(54) METHOD OF FORMING THIN FILM USING ATOMIC LAYER DEPOSITION METHOD

(75) Inventors: Yeong-kwan Kim, Sungnam (KR); Young-wook Park, Kyungki-do (KR); Jae-soon Lim, Seoul (KR); Sung-je Choi, Seoul (KR); Sang-in Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 77 days.

(21) Appl. No.: 09/679,559

(22) Filed: Oct. 6, 2000

Related U.S. Application Data

(63) Continuation-in-part of application No. 09/414,526, filed on Oct. 8, 1999, now abandoned.

(30) Foreign Application Priority Data

| | | |
|---|---|---|
| Oct. 6, 1999 | (KR) | 99-0043056 |
| Nov. 16, 1999 | (KR) | 99-0050902 |
| Mar. 23, 2000 | (KR) | 2000-0014824 |
| Sep. 8, 2000 | (KR) | 2000-0053415 |

(51) Int. Cl.$^7$ .................................................. C30B 25/04
(52) U.S. Cl. ............................. 117/89; 117/93; 117/95; 117/102
(58) Field of Search ............................. 117/84, 89, 93, 117/95, 102

(56) References Cited

U.S. PATENT DOCUMENTS

| | | |
|---|---|---|
| 4,058,430 A | 11/1977 | Suntola et al. |
| 5,082,798 A | 1/1992 | Arimoto |
| 5,374,570 A | 12/1994 | Nasu et al. .................... 437/40 |
| 5,693,139 A | 12/1997 | Nishizawa et al. |
| 5,693,579 A | 12/1997 | Ishikawa |
| 6,090,442 A | 7/2000 | Klaus et al. ............ 427/255.15 |
| 6,124,158 A | 9/2000 | Dautartas et al. |

FOREIGN PATENT DOCUMENTS

| | | |
|---|---|---|
| GB | 2 162 862 A | 2/1986 |
| GB | 2 192 198 A | 1/1988 |
| GB | 2 198 152 A | 6/1988 |
| GB | 2 198 454 A | 6/1988 |
| GB | 2 340 508 A | 2/2000 |
| JP | 1-179423 | 7/1989 |
| JP | 1-204434 | 8/1989 |
| JP | 11-269652 | 10/1999 |

OTHER PUBLICATIONS

Y. Kim et al.; "Substrate Dependence On The Optical Properties Of Al2O3 Films Grown By Atomic Layer Deposition"; Applied Physics Letter, vol. 71, No. 25, Dec. 22, 1997; pp. 3604–3606.

G–I Oya et al., "Growth of a–Al2O3 Films by Molecular Layer Epitaxy", pp. 1143–1145, Applied Physics Letters vol. 51, Oct. 12, 1987.

*Primary Examiner*—Felisa Hiteshew
(74) *Attorney, Agent, or Firm*—Volentine Francos, PLLC

(57) ABSTRACT

In a method of forming a thin film using an atomic layer deposition (ALD) method, a thin film is formed on a substrate in cycles. Each cycle includes injecting a first reactant including an atom that forms the thin film and a ligand into a reaction chamber that includes the substrate, purging the first reactant, injecting a second reactant into the reaction chamber, and purging the second reactant. The thin film is formed by a chemical reaction between the atom that forms the thin film and a second reactant whose binding energy with respect to the atom that forms the thin film is larger than the binding energy of the ligand with respect to the atom that forms the thin film and the generation of by-products is prevented. The generation of a hydroxide by-product in the thin film is suppressed by using a material that does not include a hydroxide as the second reactant, purging the second reactant, and reacting the second reactant with a third reactant that includes hydroxide. After purging the second reactant, the third reactant for removing impurities and improving the stoichiometry of the thin film is injected and purged. In this way, it is possible to obtain a thin film that does not include impurities and whose stoichiometry is excellent.

32 Claims, 23 Drawing Sheets

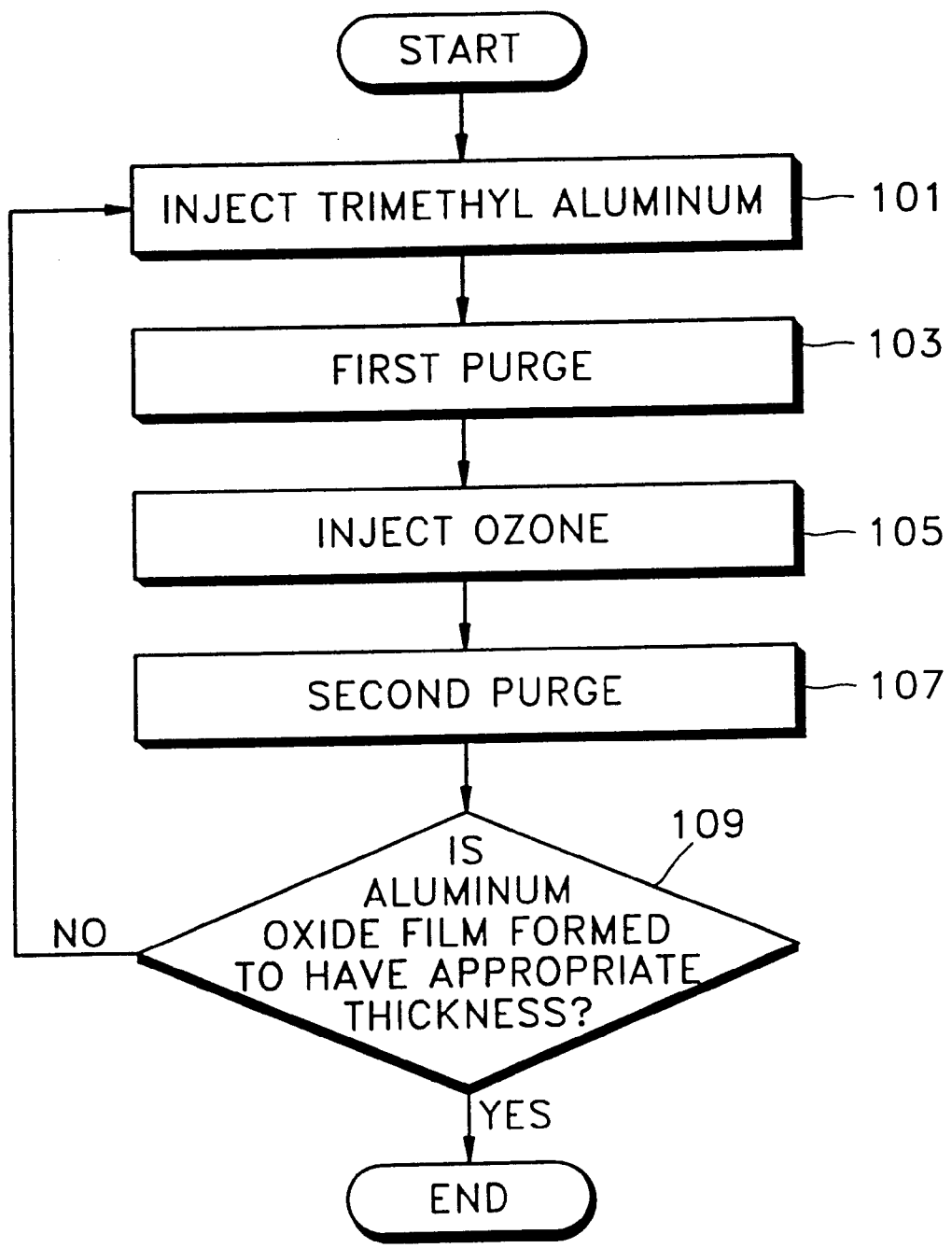

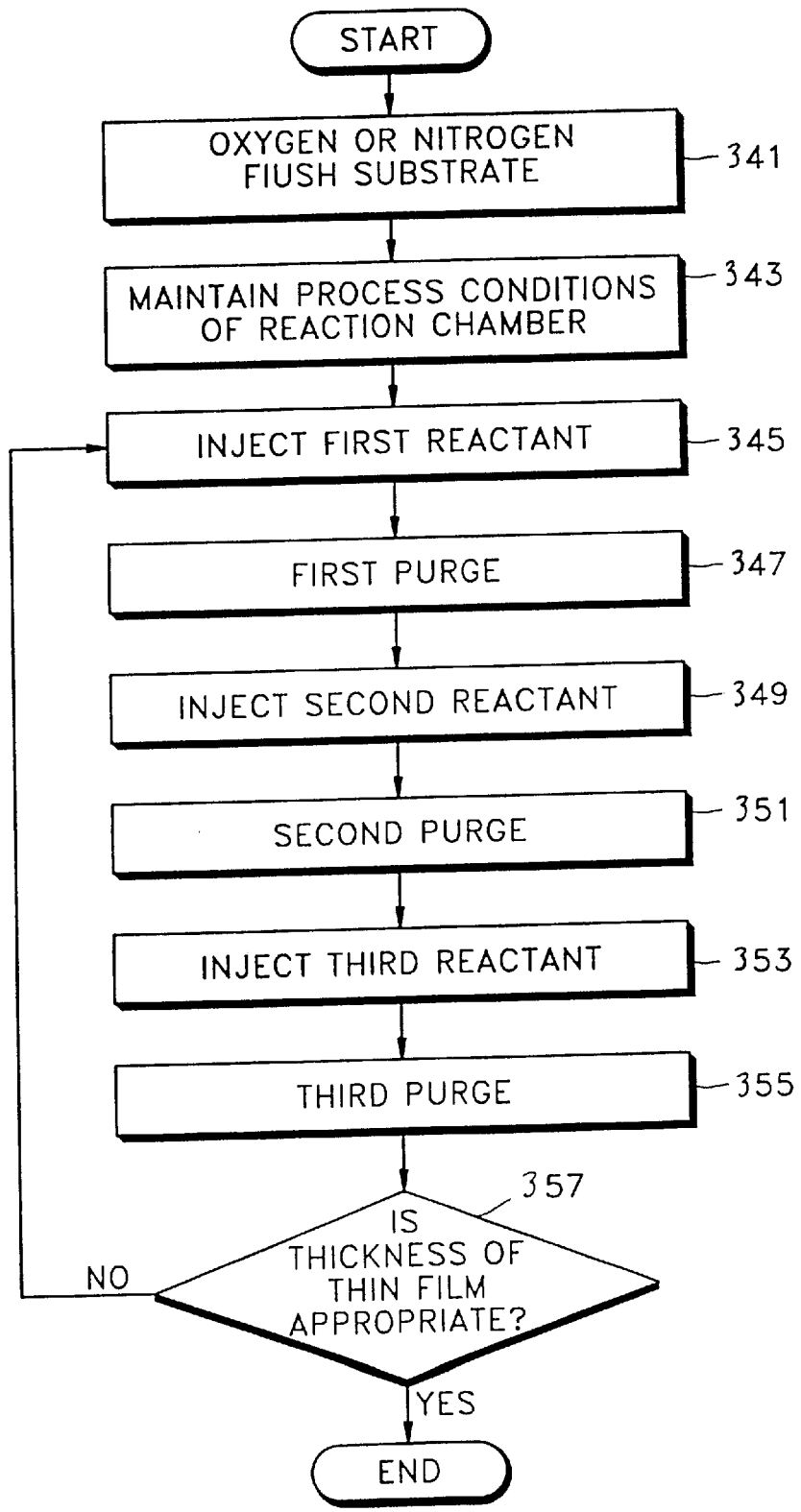

METHOD OF FORMING THIN FILM USING ATOMIC LAYER DEPOSITION METHOD

This application is a continuation-in-part application of "METHOD FOR MANUFACTURING THIN FILM," by Yeong-kwan KIM et al., Ser. No. 09/414,526, filed on Oct. 8, 1999 now abandoned, the contents of which are herein incorporated by reference in its entirety. This application also relies for priority upon Korean Patent Application Nos. 99-43056, 99-50902, 00-14824, and 00-53415, filed on Oct. 6, 1999, Nov. 16, 1999, Mar. 23, 2000, and Sep. 8, 2000, respectively, the contents of which are herein incorporated by reference in their entirety.

BACKGROUND OF THE INVENTION

The present invention relates to a method of forming a thin film. More particularly, the present invention relates to a method of forming a thin film using an atomic layer deposition (ALD) method.

In general, a thin film is used as a dielectric of a semiconductor device, as a transparent conductor of a liquid-crystal display, and as a protective layer of an electroluminescent thin film display. Such a thin film may be formed by a sol-gel method, a sputtering method, an electroplating method, an evaporation method, a chemical vapor deposition (CVD) method, or an ALD method.

Among these methods, it is possible to obtain a better step coverage by an ALD method than by a CVD method. Furthermore, it is possible to perform low temperature processing by the ALD method. Thus, an ALD method is more preferable in some circumstances.

In an ALD method, the thin film is formed by decomposing a reactant not by pyrolysis, but by a chemical exchange caused by the periodic supply of respective reactants. A method of forming an aluminum oxide film that can be used as a dielectric film of a semiconductor device using a conventional ALD method will be described in detail below.

FIG. 1 is a flowchart of the process of forming an aluminum oxide film using a conventional ALD method. FIGS. 2A through 2D describe the reaction mechanism during the formation of the aluminum oxide film by the method of FIG. 1.

In particular, a first reactant A, e.g., trimethylaluminum ($Al(CH_3)_3$, "TMA"), composed of aluminum $a_1$ and a methyl ligand $a_2$, is injected into a reaction chamber (not shown), containing a silicon substrate (step 1). The reaction chamber is then purged of any physisorbed first reactant A by injecting an inert gas (step 3) into the chamber. Thus, only the first reactant A that is chemisorbed into a substrate S remains bonded to the substrate S as shown in FIG. 2A.

A second reactant B, e.g., water vapor, consisting of oxygen $b_1$ and a hydrogen radical $b_2$, is then injected into the reaction chamber, which contains the substrate S onto which the first reactant A is chemisorbed (step 5). In this way, the second reactant B is chemisorbed onto the first reactant A, specifically via the oxygen $b_1$, as shown in FIG. 2B.

The hydrogen radical $b_2$ of the chemisorbed second reactant B then moves to the methyl ligand $a_2$ of the first reactant A causing the methyl ligand $a_2$ to separate from the aluminum $a_1$, as shown in FIG. 2C. Then, as shown below in chemical formula (1) and in FIG. 2D, the hydrogen radical $b_2$ of the second reactant B reacts with the separated methyl ligand $a_2$ of the first reactant A and forms a volatile vapor phase material D formed of $CH_4$. An aluminum oxide film C is then formed on the substrate S by the reaction between the aluminum $a_1$, of the first reactant A and the oxygen $b_1$, of the second reactant B.

$$2Al(CH_3)_3 + 3H_2O \rightarrow Al_2O_3 + 6CH_4 \tag{1}$$

The volatile vapor phase material D formed of $CH_4$ and the un-reacted vapor are then removed by purging the reaction chamber with an inert gas (step 7). Finally, it is necessary to determine whether the aluminum oxide film is formed to an appropriate thickness (step 9). If so, the process ends; if not, then steps 1 through 7 are cyclically repeated as necessary.

However, in a conventional ALD method, since the methyl ligand $a_2$ is removed by the movement of the hydrogen radical $b_2$, a sub-reaction occurs producing an OH radical that remains according to the movement of the hydrogen radical $b_2$, as described in chemical formula (2).

$$Al(CH_3)_3 + 3H_2O \rightarrow Al(OH)_3 + 3CH_4 \tag{2}$$

When this sub-reaction occurs, undesired impurities such as $Al(OH)_3$ are included in the aluminum oxide film C. And when impurities such as $Al(OH)_3$ are included in the film C, it is not possible to obtain the desired thin film characteristics. In particular, when an aluminum oxide film including $Al(OH)_3$ is used as a dielectric film of a semiconductor device, the portion of the aluminum oxide film that includes $Al(OH)_3$ operates as a trap site for electrons or a current leakage site, thus deteriorating the characteristics of the entire dielectric film.

SUMMARY OF THE INVENTION

It is an object of the present invention to provide a method of forming a high purity thin film by suppressing the formation of undesired impurities when an atomic layer deposition (ALD) method is used.

To achieve the above object, a method is provided of forming a thin film over a substrate using atomic layer deposition (ALD). The method includes placing the substrate into a reaction chamber; injecting a first reactant into the reaction chamber so that a portion of the first reactant is chemisorbed onto the substrate, the first reactant including a thin film atom and a ligand; purging the reaction chamber with a first inert gas to remove any of the first reactant that is only physisorbed onto the substrate; and injecting a second reactant into the reaction chamber to form the thin film in atomic layers by a chemical reaction between the thin film atom and the second reactant, and to remove the ligand without generating by-products. In this method, the binding energy of the second reactant with respect to the thin film atom is larger than the binding energy of the ligand with respect to the thin film atom.

The first reactant preferably comprises $Al(CH_3)_3$ and the second reactant comprises an activated oxidizing agent. The activated oxidizing agent preferably comprises a material selected from the group consisting of $O_3$, $O_2$ plasma, and $N_2O$ plasma.

The method may further include purging the reaction chamber with a second inert gas, after injecting the second reactant, to remove any of the second reactant that is physisorbed onto the substrate. The first and second inert gases may be the same gas.

The injecting of the first reactant into the reaction chamber, the purging of the reaction chamber with a first inert gas, the injecting of the second reactant into the reaction chamber, and the purging of the reaction chamber with a second inert gas, may be repeated a plurality of times.

According to the present invention, the ligand of the first reactant is separated by the difference in binding energy without the movement of a radical from the second reactant to the first reactant. A volatile vapor phase material is formed by the combination of ligands and the vapor phase material is purged. Accordingly, since it is possible to reduce the impurities generated in the thin film by a sub-reaction without the movement of the radical, it is possible to obtain a high purity thin film.

An alternate method of forming a thin film using an ALD method is also provided. This alternate method includes placing a substrate into a reaction chamber; injecting a first reactant into the reaction chamber so that a portion of the first reactant is chemically adsorbed onto the substrate; purging the reaction chamber with a first inert gas to remove any first reactant that is only physisorbed over the substrate; injecting a second reactant into the reaction chamber to chemically exchange a first portion of the chemisorbed first reactant and to form a metal-oxygen atomic layer film; purging the reaction chamber with a second inert gas to remove any of the second reactant that is physisorbed over the substrate; and injecting a third reactant into the reaction chamber to form a metal oxide film in units of atomic layers by chemically exchanging a second portion of the chemisorbed first reactant. In this method, the second reactant does not contain a hydroxide. The injecting of the third reactant into the reaction chamber operates to prevent the generation of hydroxide.

The first reactant is preferably a metal reactant, the second reactant is preferably $N_2O$, $O_2$, $O_3$, or $CO_2$, and the third reactant is preferably an oxidizing gas. The reaction chamber is preferably maintained to be between 100 and 400° C. from the injecting the first reactant to the injecting the third reactant. The metal oxide film preferably comprises a material selected from the group consisting of an $Al_2O_3$ film, a $TiO_2$ film, a $ZrO_2$ film, an $HfO_2$ film, a $Ta_2O_5$ film, an $Nb_2O_5$ film, a $CeO_2$ film, a $Y_2O_3$ film, an $SiO_2$ film, an $In_2O_3$ film, an $RuO_2$ film, an $IrO_2$ film, an $SrTiO_3$ film, a $PbTiO_3$ film, an $SrRuO_3$ film, a $CaRuO_3$ film, a $(Ba,Sr)TiO_3$ film, a $Pb(Zr,Ti)O_3$ film, a $(Pb,La)(Zr,Ti)O_3$ film, an $(Sr,Ca)RuO_3$ film, a $(Ba,Sr)RuO_3$ film, an $In_2O_3(ITO)$ film doped with Sn, and an $I_2O_3$ film doped with Zr.

A dangling bond on a surface of the substrate is preferably terminated by injecting an oxidizing gas into the reaction chamber before injecting the first reactant. In this case, the substrate is a silicon substrate.

The method may further include purging the reaction chamber with a third inert gas after injecting the third reactant into the reaction chamber, to remove any of the third reactant physisorbed over the substrate. The first, second, and third inert gases are preferably the same.

The injecting of the first reactant into the reaction chamber, the purging of the reaction chamber with the first inert gas, the injecting of the second reactant into the reaction chamber, the purging of the reaction chamber with the second inert gas, the injecting of the third reactant into the reaction chamber, and the purging of the reaction chamber with the third inert gas, may be repeated a plurality of times.

The method may further include injecting a fourth reactant into the reaction chamber, after purging of the reaction chamber with the third inert gas, to remove any impurities and to improve the stoichiometry of the metal oxide film. The fourth reactant is preferably ozone gas.

Yet another method is provided of forming a thin film using an ALD method. This method includes loading a substrate into a reaction chamber; injecting a first reactant into the reaction chamber so that a portion of the first reactant is chemically adsorbed into the substrate; purging the reaction chamber with a first inert gas to remove any of the first reactant that is only physisorbed over the substrate; injecting a second reactant into the reaction chamber to form the thin film in units of atomic layers by chemically exchanging the first reactant to further contribute to the formation of the second reactant; purging the reaction chamber with a second inert gas to remove any of the second reactant that is physisorbed over the substrate; and injecting a third reactant into the reaction chamber to remove impurities and improving the stoichiometry of the thin film.

The first reactant preferably comprises a metal reactant and the second and third reactants comprise oxidizing gases. The thin film preferably comprises a metal oxide film formed of a single atomic oxide or a composite oxide. The single atomic oxide preferably comprises a material selected from the group consisting of $Al_2O_3$, $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$. The composite oxide preferably comprises a material selected from the group consisting of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $In_2O_3$ doped with Sn, $In_2O_3$ doped with Fe, and $In_2O_3$ doped with Zr. The first reactant is preferably a metal reactant and the second and third reactants are preferably nitriding gases. The thin film preferably comprises a metal nitride film formed of a single atomic nitride or a composite nitride. The single atomic nitride preferably comprises a material selected from the group consisting of SiN, NbN, ZrN, TiN, TaN, $Ya_3N_5$, AlN, GaN, WN, and BN. The composite nitride preferably comprises a material selected from the group consisting of WBN, WSiN, TiSiN, TaSiN, AlSiN, and AlTiN.

The method may further include purging the reaction chamber with a third inert gas, after injecting the third reactant, to remove any of the third reactant that is physisorbed over the substrate. The first, second, and third inert gases are preferably the same gas.

The injecting of the first reactant into the reaction chamber, the purging of the reaction chamber with the first purge gas, the injecting of the second reactant into the reaction chamber, the purging of the reaction chamber with the second purge gas, the injecting of the third reactant into the reaction chamber, the purging of the reaction chamber with the third purge gas, may be repeated a plurality of times.

A dangling bond on a surface of the substrate may be terminated by injecting oxidizing gas or nitriding gas into the reaction chamber before injecting the first reactant. In this case, the substrate is a silicon substrate.

The temperature of the reaction chamber is preferably maintained to be between 100 and 400° C. from the injecting of the first reactant to the injecting of the third reactant.

According to these methods of forming the atomic layer thin film of the present invention, it is possible to prevent or suppress the formation of an undesired by-product such as hydroxide, to thus obtain a high purity thin film.

BRIEF DESCRIPTION OF THE DRAWINGS

The above object and advantages of the present invention will become more apparent by describing in detail preferred embodiments thereof with reference to the attached drawings in which:

FIG. 5 is a flowchart of the process of forming an aluminum oxide film according to the first preferred embodiment of the present invention;

FIG. 26 is a flowchart of a method of forming a thin film using an ALD method according to a third preferred embodiment of the present invention;

DESCRIPTION OF THE PREFERRED EMBODIMENTS

Figure 1:
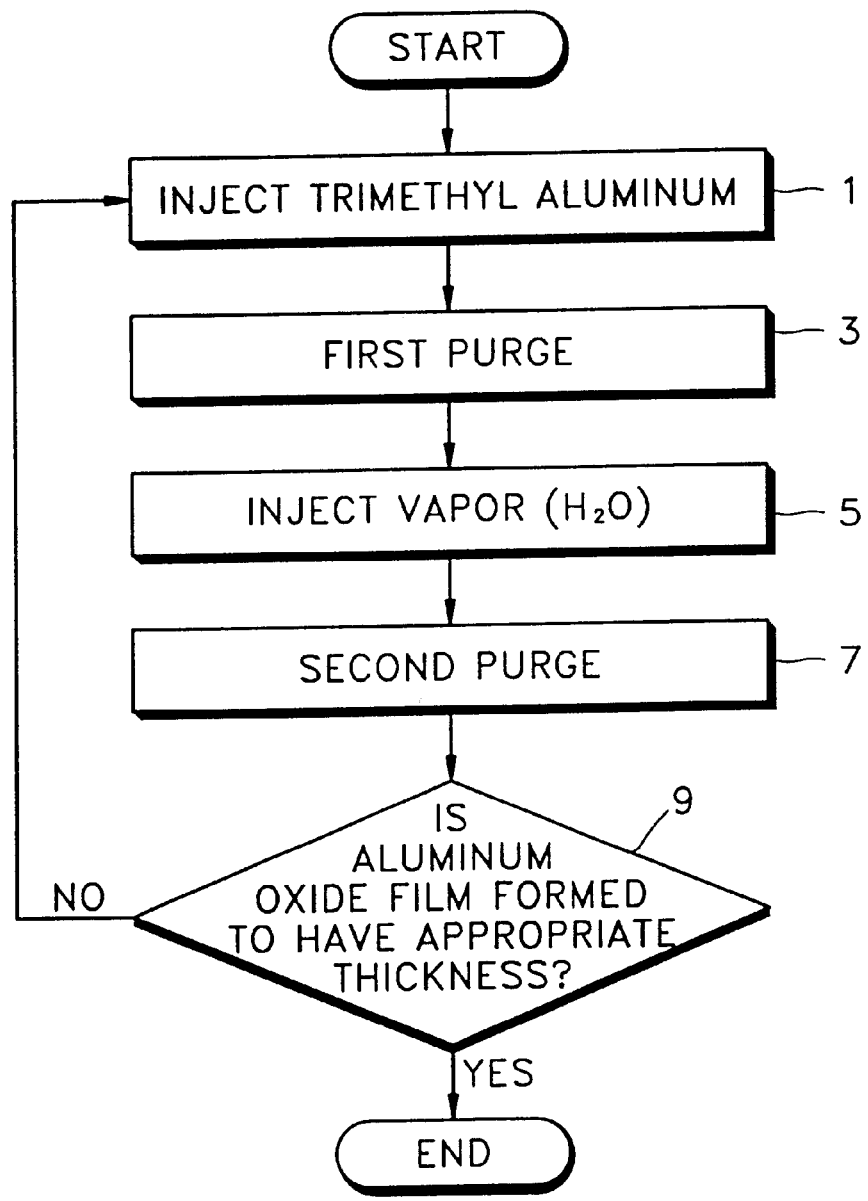
FIG. 1 is a flowchart of the process of forming an aluminum oxide film using a conventional atomic layer deposition (ALD) method.
Figure 2A:
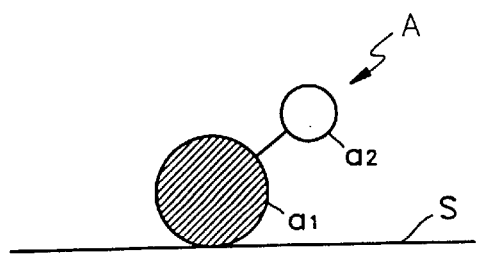
FIGS. 2A through 2D illustrate the reaction mechanism during the formation of the aluminum oxide film of FIG. 1.
Figure 2B:
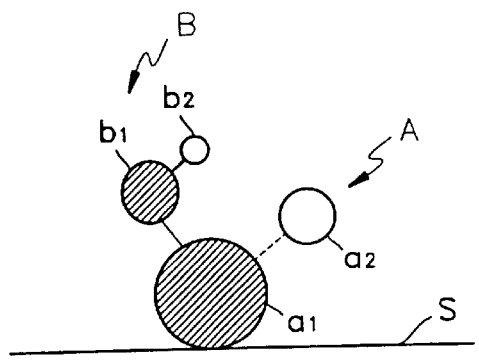
Figure 2C:
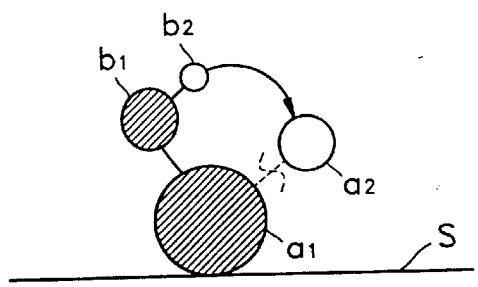
Figure 2D:
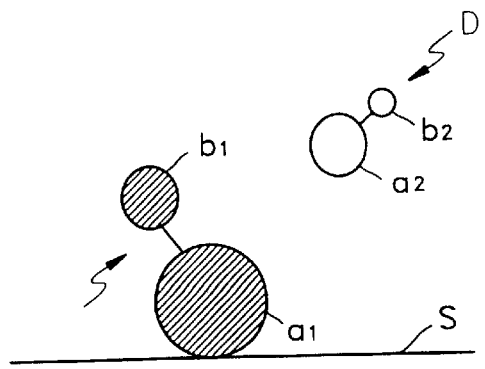

The present invention now will be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same elements, and elements will only be described once.

Figure 3:
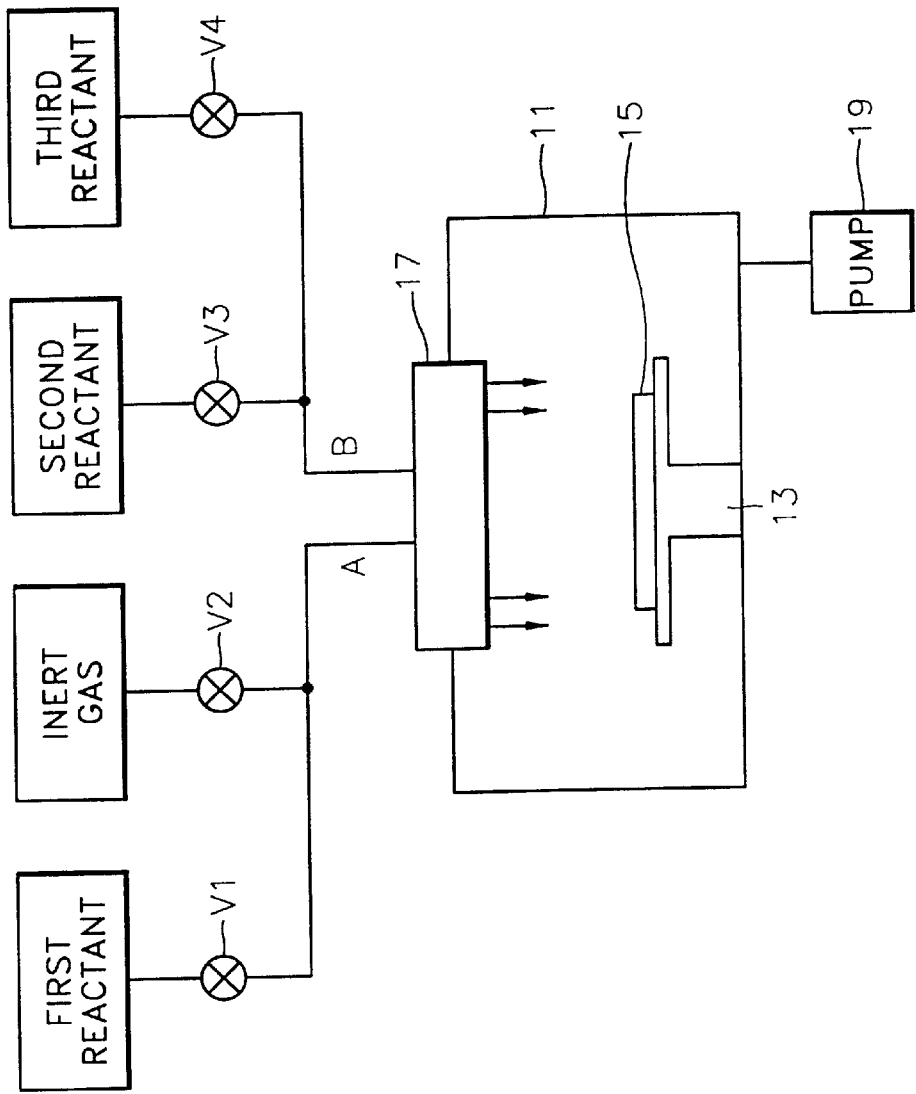
FIG. 3 schematically illustrates an apparatus for forming an atomic layer thin film by an ALD method according to preferred embodiments of the present invention.
Figure 4A:
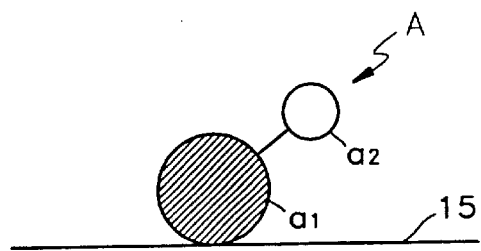
FIGS. 4A through 4D illustrate the reaction mechanism of a method of forming a thin film using an ALD method according to a first preferred embodiment of the present invention.
Figure 4B:
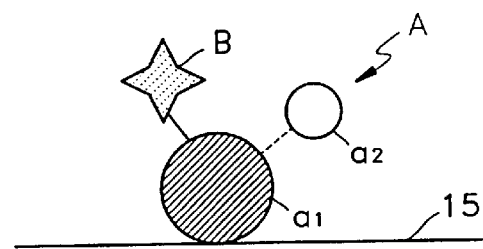
Figure 4C:
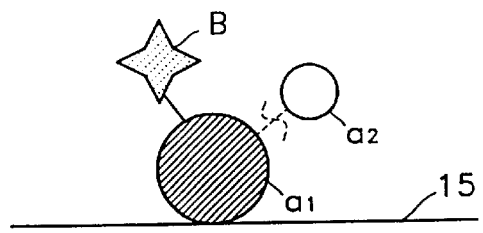
Figure 4D:
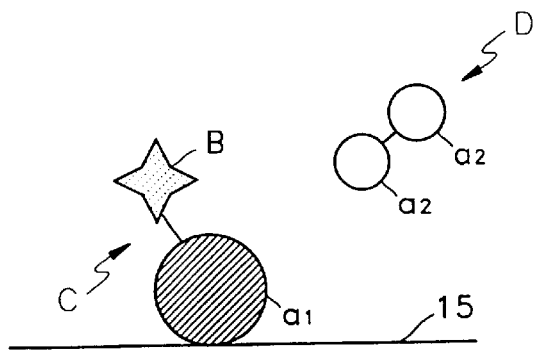

FIG. 3 illustrates an apparatus for forming an atomic layer thin film using an atomic layer deposition (ALD) method according to preferred embodiments of the present invention. The apparatus includes a reaction chamber 11, a susceptor 13, a shower head 17, and a vacuum pump 19.

The reaction chamber 11 that can be heated by an external heater (not shown). The susceptor 13 is installed at the bottom of the reaction chamber 11 and operates to support a substrate 15, e.g., a silicon substrate. The shower head 17 is installed above the susceptor 13 so that reaction gas may be injected into the reaction chamber 11. The vacuum pump 19 is connected to the reaction chamber 11 in order to control the pressure inside the reaction chamber 11.

Two gas inlets A and B, which are separated from each other, are connected to the shower head 17. Via these gas inlets A and B, a first reactant, an inert gas, a second reactant, and a third reactant can be injected into the shower head 17. The first reactant is preferably a metal reactant; the inert gas is preferably nitrogen gas or argon gas; the second reactant is preferably an oxidizing gas that does not contain a hydroxide, e.g., $N_2O$, $O_2$, $O_3$, $CO_2$ gas, or water vapor; and the third reactant is preferably water vapor or a material that includes an oxygen radical as an activated oxidizing agent, such as ozone, $O_2$ plasma, or $N_2O$ plasma. In FIG. 3, the second reactant and the third reactant are installed separately. However, in alternate embodiments they can be installed together.

The first reactant and the inert gas are injected into the reaction chamber 11 through the gas inlet A. The second reactant and the third reactant are injected into the reaction chamber 11 through the gas inlet B. The first reactant has a different gas inlet from the second reactant and the third reactant in order to prevent them from reacting with each other inside a gas inlet. The injection of the first reactant into the reaction chamber 11 is controlled by a first valve $V_1$; the injection of the inert gas into the reaction chamber 11 is controlled by a second valve $V_2$; the injection of the second reactant into the reaction chamber 11 is controlled by a third valve $V_3$; and the injection of the third reactant into the reaction chamber 11 is controlled by a fourth valve $V_4$.

Various embodiments of a method according to the present invention of forming an atomic layer thin film using the above-described apparatus will now be described below.

First Preferred Embodiment

FIGS. 4A through 4D illustrate the reaction mechanism of a method of forming a thin film using an ALD method according to a first preferred embodiment of the present invention. Initially a first reactant A, consisting of an atom $a_1$ that forms a thin film and a ligand $a_2$, is chemisorbed onto a substrate 15, e.g., a silicon substrate. This is preferably done by injecting the first reactant A into a reaction chamber 11 into which the substrate 15 is loaded. Afterwards, any physisorbed first reactant A is removed by purging the reaction chamber by injecting the inert gas into the reaction chamber 11. (See FIG. 4A)

A second reactant B is then injected into the reaction chamber 11 containing the substrate 15 onto which the first reactant A is adsorbed, and the second reactant B is chemisorbed onto the first reactant A. Preferably an imperfect material that actively reacts with the first reactant A is used as the second reactant B. More preferably the second reactant B is chosen such that the binding energy between the second reactant B and the thin film forming atom $a_1$ of the first reactant A is larger than the binding energy between the thin film forming atom aof the first reactant A and the ligand $a_2$ of the first reactant A. (See FIG. 4B)

Since the binding energy between the second reactant B and the thin film forming atom $a_1$ of the first reactant A is larger than the binding energy between the thin film forming atom $a_1$ of the first reactant A and the ligand $a_2$, the second reactant B combines with the thin film forming atom $a_1$ of the first reactant A and the ligand $a_2$ separates from the first reactant A. (See FIG. 4C)

Furthermore since the ligand $a_2$ separated from the first reactant A is unstable, a volatile vapor phase material D is formed by combination of the ligands $a_2$. A thin film C in units of atomic layers is formed on the substrate 15 by a reaction between the thin film forming atom $a_1$ of the first reactant A and the second reactant B. The volatile vapor phase material D is then removed by purging the reaction chamber 11 with the inert gas. (See FIG. 4D)

An example of this thin film formation process will be described below. In this example, a thin aluminum oxide film is formed using a difference in binding energy (as described in FIGS. 4A through 4D).

FIG. 5 is a flowchart of the process of forming an aluminum oxide film according to a first preferred embodiment of the present invention. FIGS. 6A through 6D illustrate the reaction mechanism when the aluminum oxide film is formed using the ALD method of FIG. 5.

The first reactant A is initially injected into the reaction chamber 11, into which a substrate 15 is loaded (step 101). The first reactant A is preferably trimethylaluminum (Al$(CH_3)_3$, TMA), consisting of a thin film forming aluminum $a_1$ and a methyl ligand $a_2$, and the substrate 15 is preferably a silicon substrate. This results in the TMA being physically adsorbed (physisorbed) and chemically adsorbed (chemisorbed) onto the substrate 15.

Figure 6A:
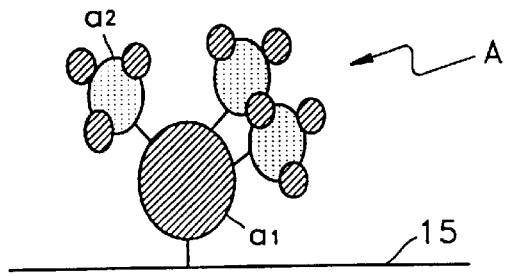
FIGS. 6A through 6D illustrate the reaction mechanism when the aluminum oxide film is formed using the ALD method of FIG. 5.

TMA that is physisorbed onto the substrate 15 is then removed by purging with inert gas (step 103), leaving only TMA that is chemisorbed into the substrate 15 remaining, as shown in FIG. 6A.

Figure 6B:
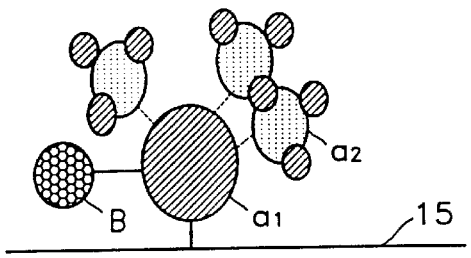

The second reactant B, e.g., an oxidizing agent such as ozone, is then injected into the reaction chamber 11, containing the substrate 15 onto which the TMA is adsorbed (step 105). This allows the ozone B to be chemisorbed onto the aluminum $a_1$ of the TMA, as shown in FIG. 6B.

Figure 6C:
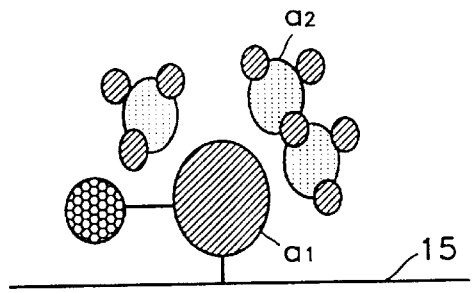

Ozone B is an imperfect material that actively reacts with TMA. The binding energy between ozone B and the aluminum $a_1$ of the TMA is about 540 kJ/mol, which is larger than the binding energy between the aluminum $a_1$ of the TMA and the methyl ligand $a_2$ (for example, Al—C binding energy), which is 255 kJ/mol. Since the binding energy between ozone B and thin film forming aluminum $a_1$ of the TMA is larger than the binding energy between thin film forming aluminum $a_1$ of the TMA, methyl ligands $a_2$, are separated from the TMA as shown in FIG. 6C.

Figure 6D:
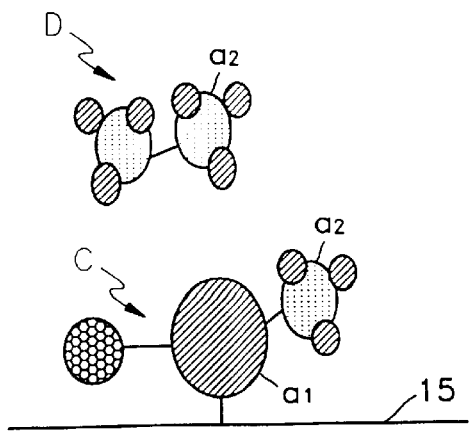

Also, since the methyl ligands $a_2$ separated from the TMA are also unstable, a volatile vapor phase material D formed of $C_2H_6$ is formed by the combination of the methyl ligands $a_2$ as shown in FIG. 6D. Meanwhile, an aluminum oxide film C in units of atomic layers is formed on the substrate 15 by the reaction between thin film forming aluminum $a_1$ of the TMA and the ozone B.

The process of forming this metal film is as shown in chemical formula (3).

$$2Al(CH_3)_3 + O_3 \rightarrow Al_2O_3 + 3C_2H_6 \qquad (3)$$

The volatile vapor phase material D formed of $C_2H_6$ and the un-reacted methyl ligands $a_2$ are then removed by purging the reaction chamber 11 a second time with the inert gas (step 107). Then, the thickness of the aluminum oxide film is checked to see if it is formed to an appropriate thickness (step 109). If it is thick enough, processing ends; if not, then steps 101 through 107 are cyclically repeated as necessary.

Ozone is used as the second reactant in this preferred embodiment. However, the ozone can be activated more using ultraviolet (UV) rays, or $O_2$ plasma or $N_2O$ plasma can be used as the activated oxidizing agent instead of ozone.

Equation (4) shows how the process is performed if activated $O_2$ is used as a second reactant.

$$TMA + O_2(activated) \rightarrow 4Al(CH_3)_3 + 3O_2 \rightarrow Al_2O_3 + 6C_2H_6 \qquad (4)$$

Figure 7:
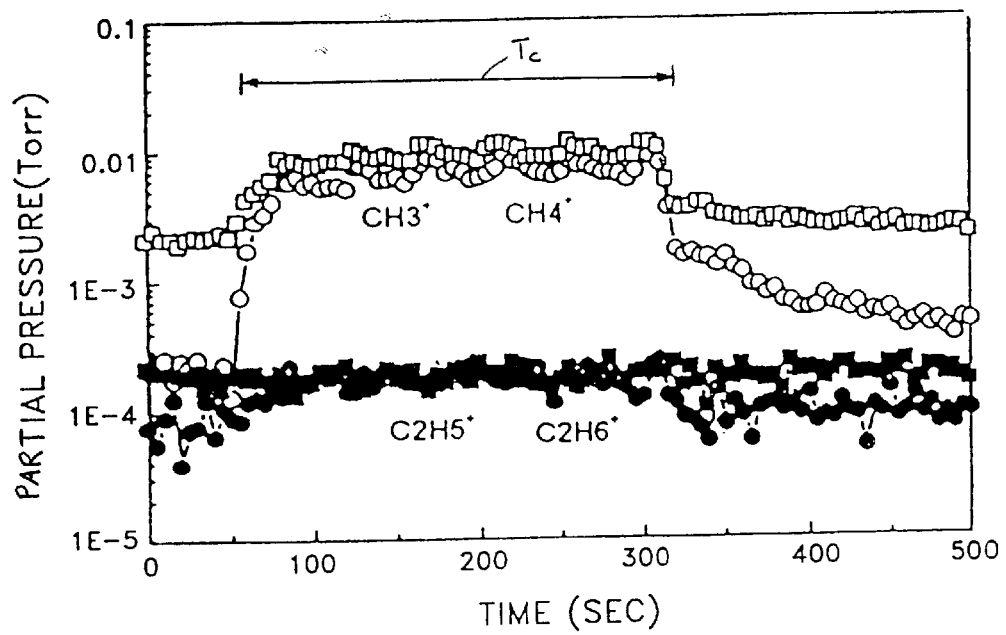
FIG. 7 is a graph showing residual gas analysis (RGA) data when the aluminum oxide film is formed by the conventional technology.
Figure 8:
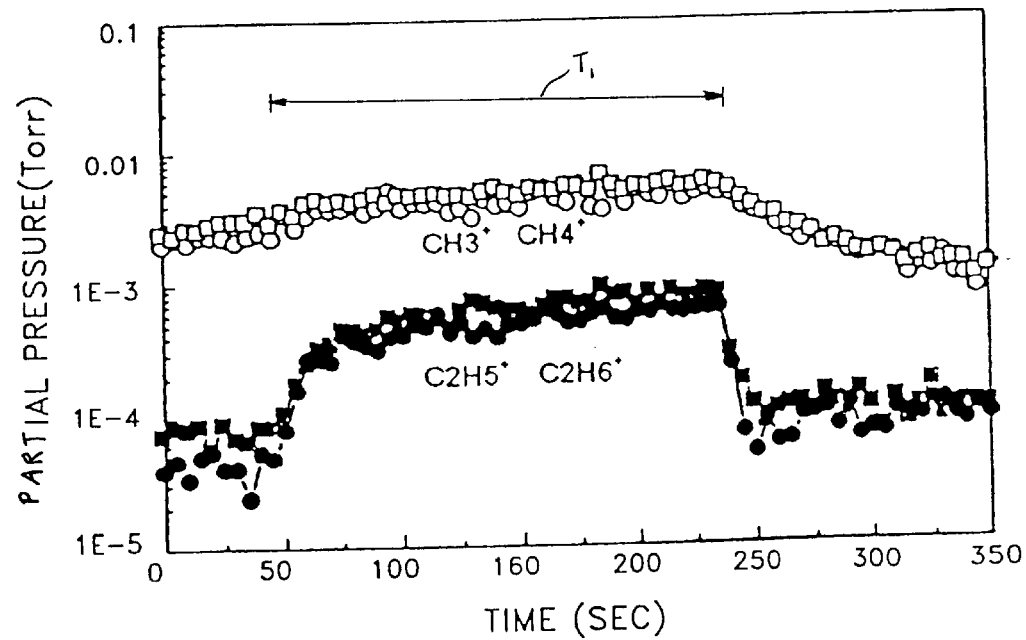
FIG. 8 is a graph showing residual gas analysis (RGA) data when the aluminum oxide film is formed by the first preferred embodiment of the present invention.

FIGS. 7 and 8 are graphs showing residual gas analysis (RGA) data when an aluminum oxide film is formed by the conventional technology and the first preferred embodiment of the present invention, respectively. In FIGS. 7 and 8, the aluminum oxide film is formed in the time designated by the lines $T_c$ and $T_1$.

Since the form of the removed ligand varies according to the mechanism with which the second reactant B reacts with the first reactant A, as mentioned above, the material generated during a process varies. In other words, when TMA and water vapor ($H_2O$) are used as the first reactant A and the second reactant B, respectively (as in the case shown for FIG. 7), $CH_3^+$ and $CH_4^-$, which are formed by receiving a hydrogen radical from water vapor ($H_2O$), are detected as the main by-products. However when TMA and ozone are used as the first reactant A and the second $CH_3$ reactant B, respectively, (as is the case shown for FIG. 8), $CH_3$ ligands are removed. As a result of this removal, it is $C_2H_5^+$ or $C_2H_6^-$ that are detected as a main by-product.

Figure 9:
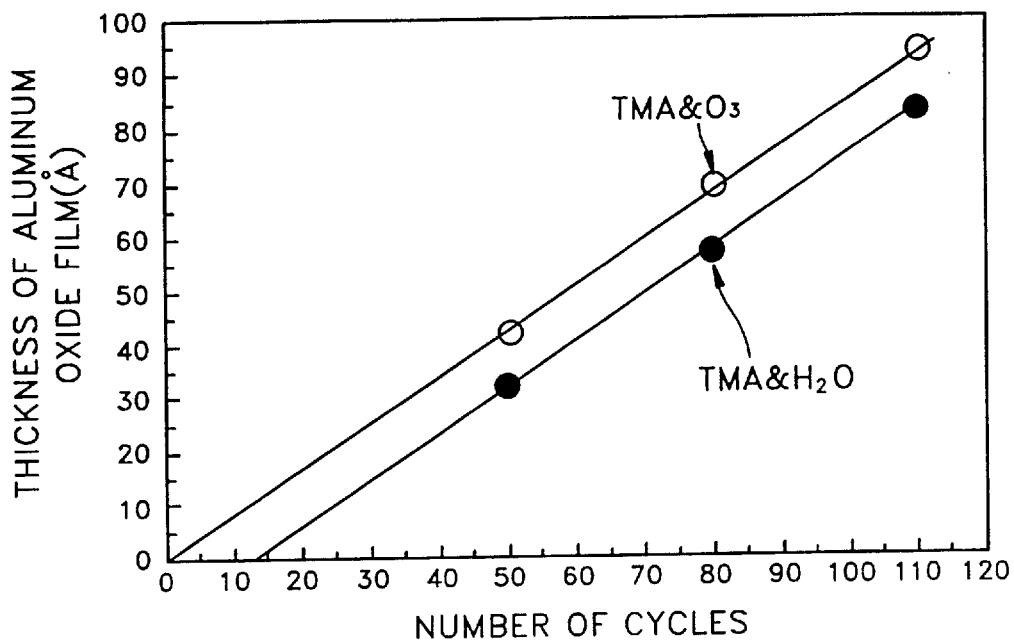
FIG. 9 is a graph showing the thickness of the aluminum oxide film according to the number of cycles when the aluminum oxide film is formed by the conventional technology and the first preferred embodiment of the present invention.

FIG. 9 is a graph showing the thickness of the aluminum oxide film according to the number of reactant supply cycles when the aluminum oxide film is formed by the conventional technology and by the first preferred embodiment of the present invention. The thickness of a deposited thin film is determined by the number of supply cycles of each reactant since an atomic layer deposition (ALD) method is a surface controlling process. In other words, since the film is formed by an ALD method, the thickness increases linearly according to the number of reactant supply cycles. As shown in FIG. 9, since the thickness linearly increases in the conventional technology and in the present invention, it is noted that the thin film is formed by an ALD method.

The difference in latent cycles between the conventional technology (marked with ●), in which water vapor is used as the second reactant B, and the first preferred embodiment of the present invention (marked with ○), in which ozone is used as the second reactant B is shown. As seen in FIG. 9, the thin film is deposited from an initial cycle without any latent cycles when the first preferred embodiment of the present invention (marked with ○) is used. In contrast, when the conventional technology is used (marked with ●), the thin film is deposited after the lapse of a latent period of 12 cycles. From this, it is noted that the aluminum oxide film is more stably formed in the present invention since the thin film is formed by a heterogeneous reaction.

Figure 10:
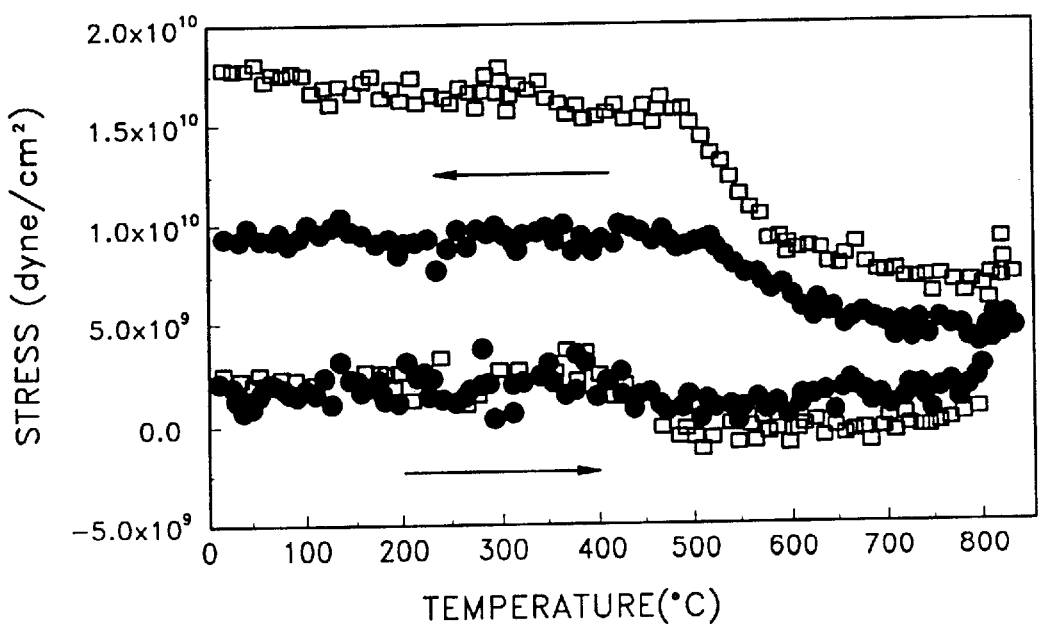
FIG. 10 is a graph showing stress hysteresis according to the temperature of aluminum oxide films formed by the conventional technology and the first preferred embodiment of the present invention.

FIG. 10 is a graph showing the stress hysteresis according to the temperature of aluminum oxide films formed by the conventional technology and the first preferred embodiment of the present invention.

To be specific, in the stress hysteresis of the conventional aluminum oxide film formed using TMA as the first reactant A and water vapor as the second reactant B (marked with □), the form of stress changes from tensile stress into compression stress at 450° C. To contrast, in the stress hysteresis of the aluminum oxide film according to the first preferred embodiment of the present invention, which is formed using TMA and ozone as the first reactant A and the second reactant B, respectively (marked with ●), the form of stress is tensile stress throughout the entire temperature range. In other words, in the first preferred embodiment of the present invention, a stress mode does not change. Accordingly, it is noted that the film formed according to the first preferred embodiment of the present invention is more stable against heat than one formed by the conventional method.

Figure 11:
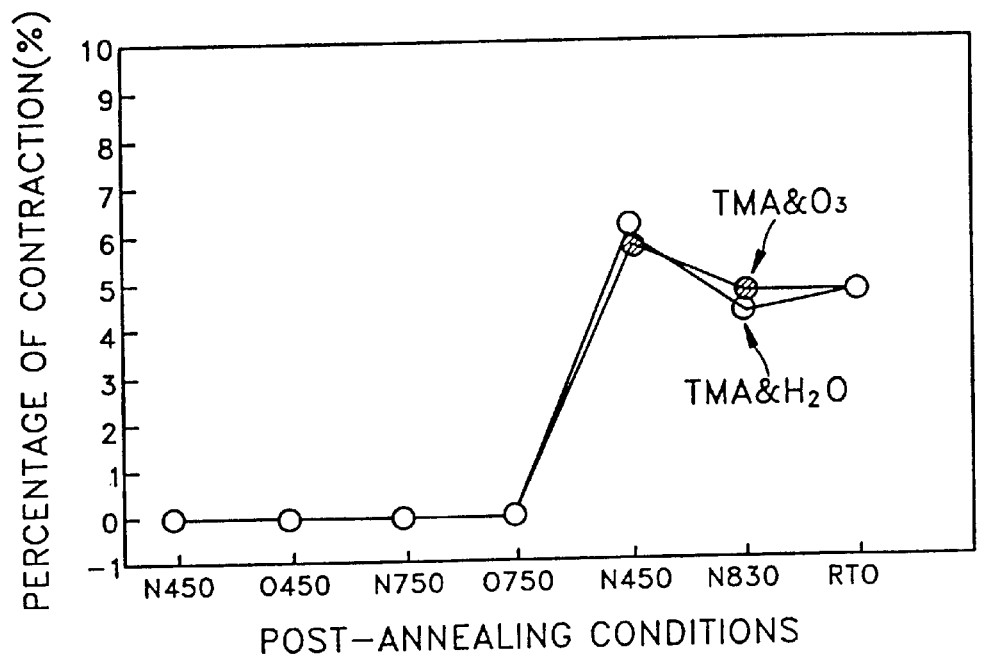
FIG. 11 is a graph showing a percentage of contraction of thickness according to the post-annealing conditions of aluminum oxide films formed by the conventional technology and the first preferred embodiment of the present invention.

FIG. 11 is a graph showing a percentage of contraction of thickness according to the post-annealing conditions of the aluminum oxide films formed by the conventional technology and the first preferred embodiment of the present invention. On the x-axis, N450, N750, and N830 indicate samples post annealed in nitrogen atmospheres at 450° C., 750° C., and 830° C., respectively; O450, O750, and O830 indicate samples post annealed in oxygen atmospheres at 450° C., 750° C., and 830° C., respectively; and RTO indicates a sample on which rapid thermal oxidation is performed at 850° C.

As FIG. 11 shows, the percentage of thickness contraction (i.e. the decreasing rate of thickness) according to the temperature and gas conditions of the post-annealing in the aluminum oxide films does not significantly vary according to whether the films were formed by the conventional technology or the first preferred embodiment of the present invention.

Figure 12:
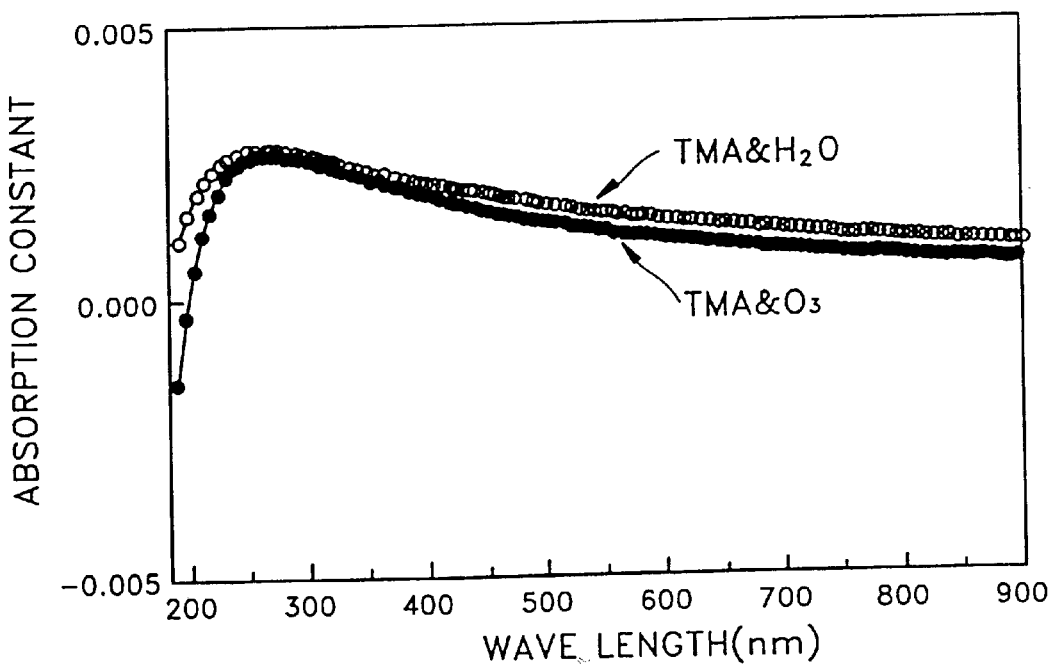
FIG. 12 is a graph showing absorption constants of aluminum oxide films formed by the conventional technology and the first preferred embodiment of the present invention according to wavelength.
Figure 13:
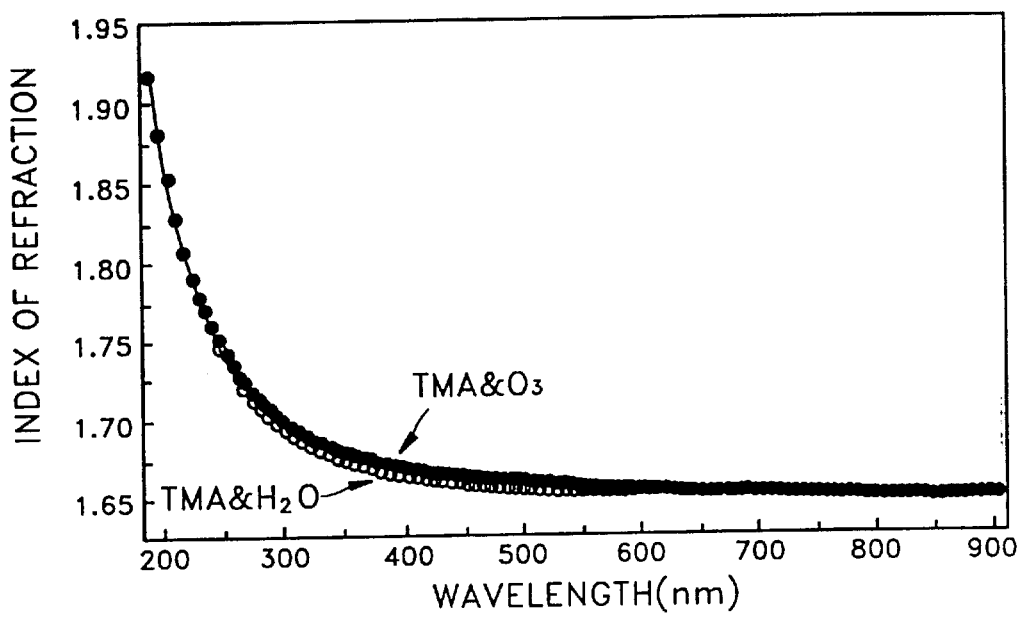
FIG. 13 is graph showing indices of refraction of aluminum oxide films formed by the conventional technology and the first preferred embodiment of the present invention according to wavelength.

FIGS. 12 and 13 are graphs showing absorption constants and indices of refraction of the aluminum oxide films formed by the conventional technology and the first preferred embodiment of the present invention according to wavelength. The absorption constants of the aluminum oxide films formed by the conventional technology and the first preferred embodiment of the present invention are less than 0.005 for wavelengths of 180 through 900 nm as shown in FIG. 12. In other words, the aluminum oxide films formed by the conventional technology and the first preferred embodiment of the present invention both show excellent transparency.

Similarly, the indices of refraction of the aluminum oxide films formed by the conventional technology and the first preferred embodiment of the present invention do not significantly vary for wavelengths of 180 through 900 nm as shown in FIG. 13.

Figure 14:
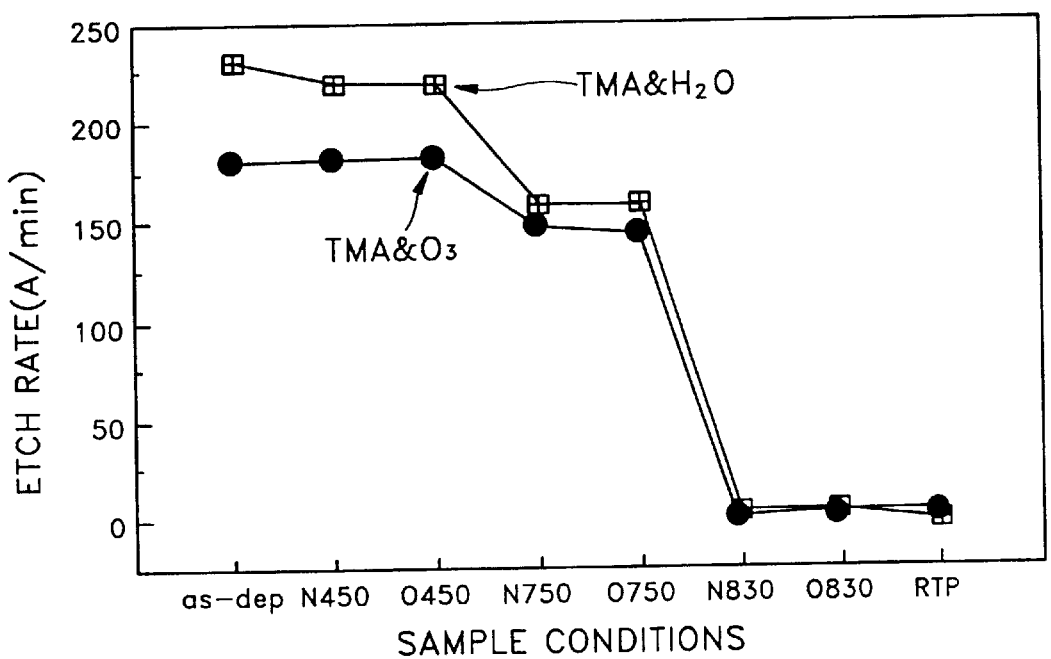
FIG. 14 is a graph showing wet etch rates of aluminum oxide films formed by the conventional technology and the first preferred embodiment of the present invention according to post-annealing temperature and the atmosphere gas.

FIG. 14 is a graph showing wet etch rates of aluminum oxide films formed by the conventional technology and the first preferred embodiment of the present invention according to post-annealing temperature and the atmosphere gas. On the x-axis, as-dep indicates a sample that is not annealed after being deposited on the substrate; N450, N750, and N830 indicate sample that are post-annealed in nitrogen atmospheres at 450° C., 750° C., and 830° C.; O450, O750, and O830 indicate samples that are post-annealed in oxygen atmospheres at 450° C., 750° C., and 830° C.; and RTP indicates a sample that underwent rapid thermal oxidation in an oxygen atmosphere at 850° C. The y-axis denotes etch rates when the respective samples are wet etched by a 200:1 HF solution.

As shown in FIG. 14, in the aluminum oxide films formed by the conventional technology and the first preferred embodiment of the present invention, wet etch rates are reduced as annealing temperatures increase, regardless of the annealing conditions. In particular, when post-annealing is performed at temperatures higher than 800° C., the etch rate is rapidly reduced to 2 through 3 Å/min. Also, when post-annealing is performed at temperatures lower than 800° C., the etch rate of the aluminum oxide film according to the first preferred embodiment of the present invention is lower than the etch rate of the aluminum oxide film according to the conventional technology by about 30%. Thus, FIG. 14 shows that the oxide film is more chemically stable when ozone is used as an oxidizing gas than when water vapor is used as the oxidizing gas.

A case where the aluminum oxide film formed by the first preferred embodiment of the present invention is used for a semiconductor device, will now be described.

Figure 15:
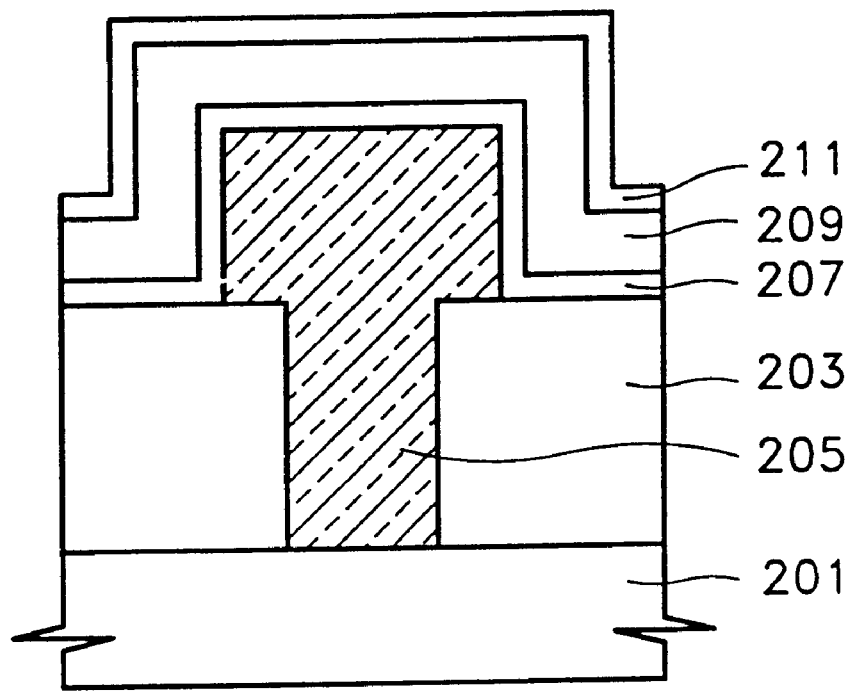
FIG. 15 is a sectional view showing the structure of a capacitor of a semiconductor device, for which a dielectric film formed by the first preferred embodiment of the present invention is used.

FIG. 15 is a sectional view showing the structure of a capacitor of a semiconductor device, for which a dielectric film formed by the first preferred embodiment of the present invention is used. The capacitor of the semiconductor device, for which the dielectric film formed by the first preferred embodiment of the present invention is used, includes a lower electrode 205, a capacitor dielectric film 207, and an upper electrode 209. The capacitor is formed over a substrate 201 and an interlayer dielectric film 203, and is covered with a capping layer 11.

The lower electrode 205 is preferably formed over the substrate 201, and the interlayer dielectric film 203, but contacting the substrate 201. The substrate 201 is preferably a silicon substrate.

A capacitor in which the upper electrode 209 and the lower electrode 205 are formed of a polysilicon film doped with impurities and in which the capacitor dielectric film 207 is formed of an aluminum oxide film formed by the first preferred embodiment of the present invention, is referred to as an "SIS capacitor."

A capacitor in which the lower electrode 205 is formed of a polysilicon film doped with the impurities, the capacitor dielectric film 207 is formed of an aluminum oxide film formed by the first preferred embodiment of the present invention, and the upper electrode 209 is formed of a TiN film, is referred to as an "MIS capacitor."

A capacitor, in which the upper electrode 209 and the lower electrode 205 are formed of noble metals of the platinum group, such as Pt and Ru, and the capacitor dielectric film 207 is formed of an insulating film such as a TaO film or BST(BaSrTiO$_3$), is referred to as an "MIM capacitor."

Figure 16:
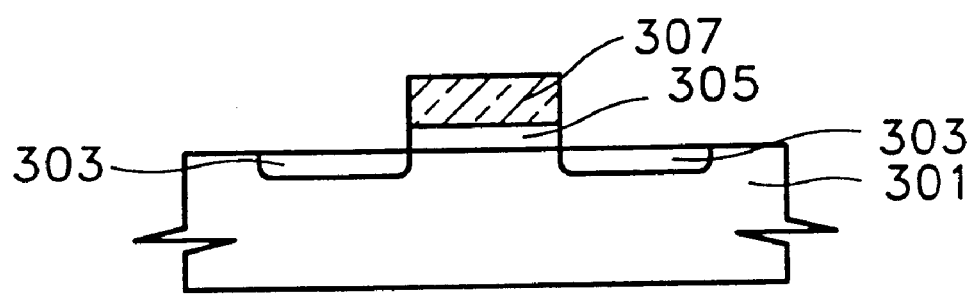
FIG. 16 is a sectional view showing the structure of a transistor of a semiconductor device, for which a dielectric film formed by the first preferred embodiment of the present invention is used.

FIG. 16 is a sectional view showing the structure of a transistor of a semiconductor device, for which a dielectric film formed by the first preferred embodiment of the present invention is used. The semiconductor device, for which the dielectric film according to the first preferred embodiment of the present invention is used includes a silicon substrate 301 doped with impurities such as phosphorus, arsenic, boron, which operates as a first electrode, a gate insulating film 305, which operates as a dielectric film, and a gate electrode 307, which operates as a second electrode. In FIG. 2, reference numeral 303 denotes source and drain regions, which are preferably impurity doped regions.

When the structure of the transistor of the semiconductor device according to the first preferred embodiment of the present invention is compared with the structure of the capacitor of the semiconductor device according to the first preferred embodiment of the present invention, the silicon substrate 301 and the gate electrode 307 correspond to the lower electrode 205 and the upper electrode 209, respectively. The gate insulating film 305 corresponds to the capacitor dielectric film 207 of the capacitor.

The insulating characteristics of the capacitor dielectric film 207 will now be described with reference to the structure of the capacitor for convenience of explanation, however, the same treatment applies to the gate insulating film 305 of the transistor.

Figure 17:
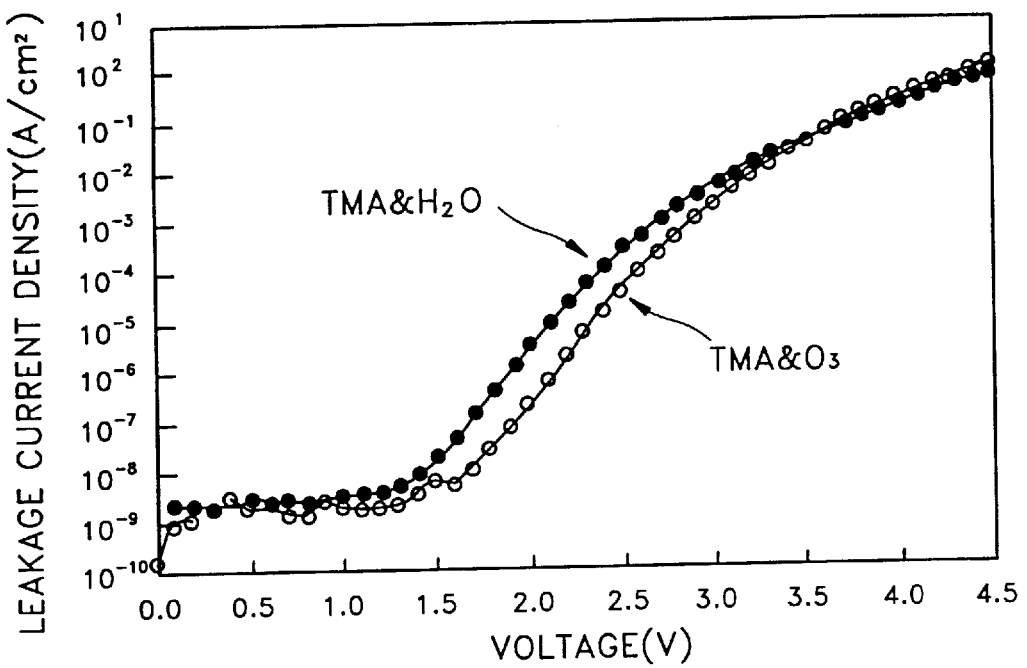
FIG. 17 is a graph illustrating the leakage current characteristics of a conventional capacitor and an SIS capacitor, for which a dielectric film formed by the first preferred embodiment of the present invention is used, according to applied voltage.

FIG. 17 is a graph illustrating the leakage current characteristics of a conventional capacitor and an SIS capacitor, for which the dielectric film formed by the first preferred embodiment of the present invention is used, according to applied voltage.

In particular, the SIS capacitor according to the first preferred embodiment of the present invention (marked with ○) is substantially the same as the conventional capacitor (marked with ●), except that the method of forming the dielectric film of the SIS capacitor is different from the method of forming the dielectric film of the conventional capacitor. However, as shown in FIG. 17, the SIS capacitor according to the first preferred embodiment of the present invention (○) shows a take off voltage larger than the take off voltage of the conventional capacitor (●) at a leakage current density that can be allowed in a capacitor of a common semiconductor device, i.e., $1 \times 10^{-7}$ A/cm$^2$. As a result, since the thickness of the dielectric film can be reduced at a certain leakage current value in the SIS capacitor according to the present invention (○), the SIS capacitor according to the first preferred embodiment of the present invention (○) is advantageous by allowing an increase in the degree of integration of the semiconductor device.

Figure 18:
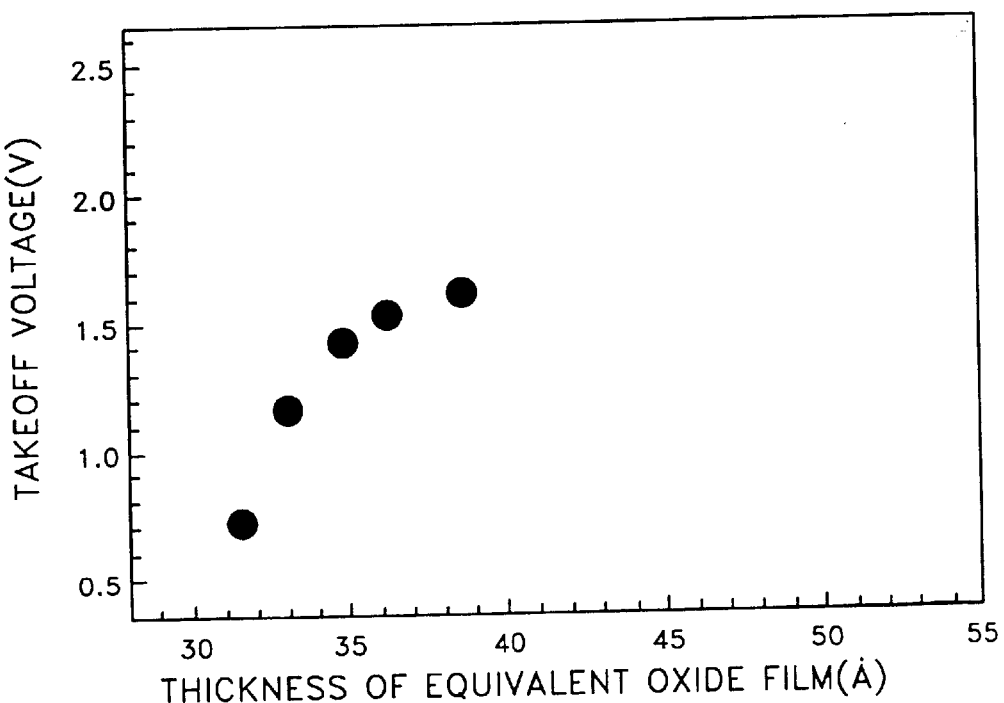
FIG. 18 is a graph showing the takeoff voltage of an SIS capacitor, for which a dielectric film formed by the first preferred embodiment of the present invention is used, according to the thickness of an equivalent oxide film.

FIG. 18 is a graph showing the takeoff voltage of the SIS capacitor in which the dielectric film formed by the first preferred embodiment of the present invention is used, according to the thickness of an equivalent oxide film. Since the SIS capacitor according first preferred embodiment of the to the present invention shows stable insulating characteristics until the thickness of the equivalent oxide film is 35 Å, the take off voltage is not significantly reduced. When the thickness of the equivalent oxide film is less than 35 Å, the takeoff voltage is rapidly reduced, and thus the insulating characteristics deteriorate.

Figure 19:
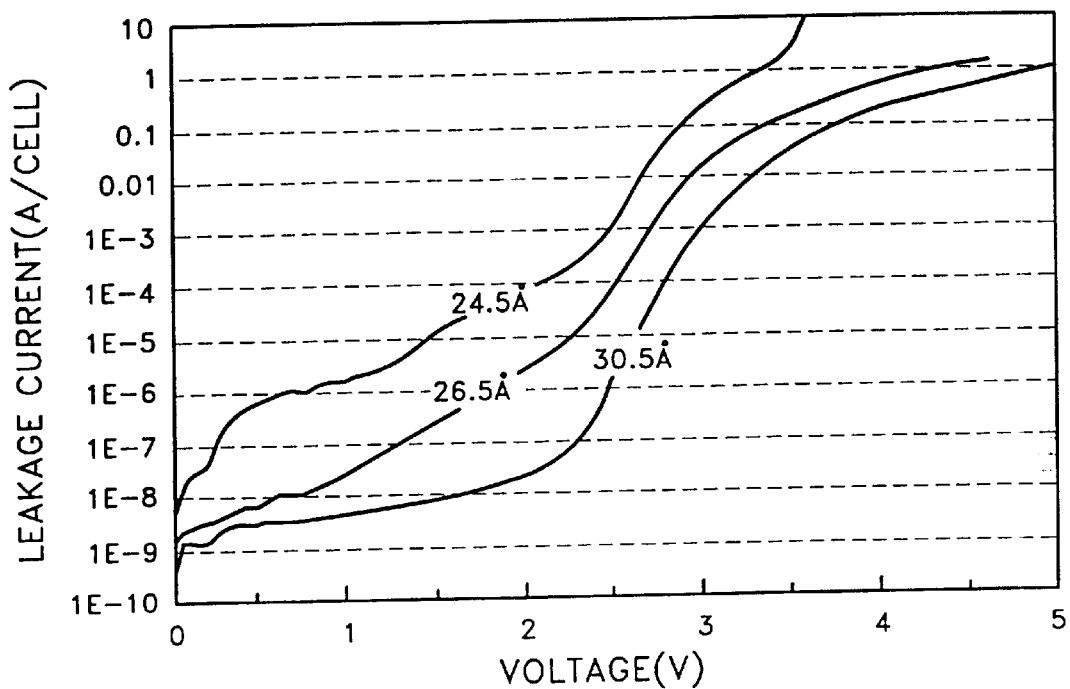
FIG. 19 is a graph showing the leakage current characteristic of a MIS capacitor, for which a dielectric film formed by the first preferred embodiment of the present invention is used, according to applied voltage.

FIG. 19 is a graph showing the leakage current characteristic of an MIS capacitor, for which the dielectric film formed by the first preferred embodiment of the present invention is used, according to the applied voltage. As a common reference value, when a leakage current density is $1 \times 10^7$ A/cell and a voltage is 1.2V, the thickness of the equivalent oxide film can be 26.5 Å in the case of the MIS capacitor according to a first preferred embodiment of the present invention. When the thickness of the equivalent oxide film is reduced, it is very advantageous for increasing the degree of integration of the semiconductor device.

Figure 20:
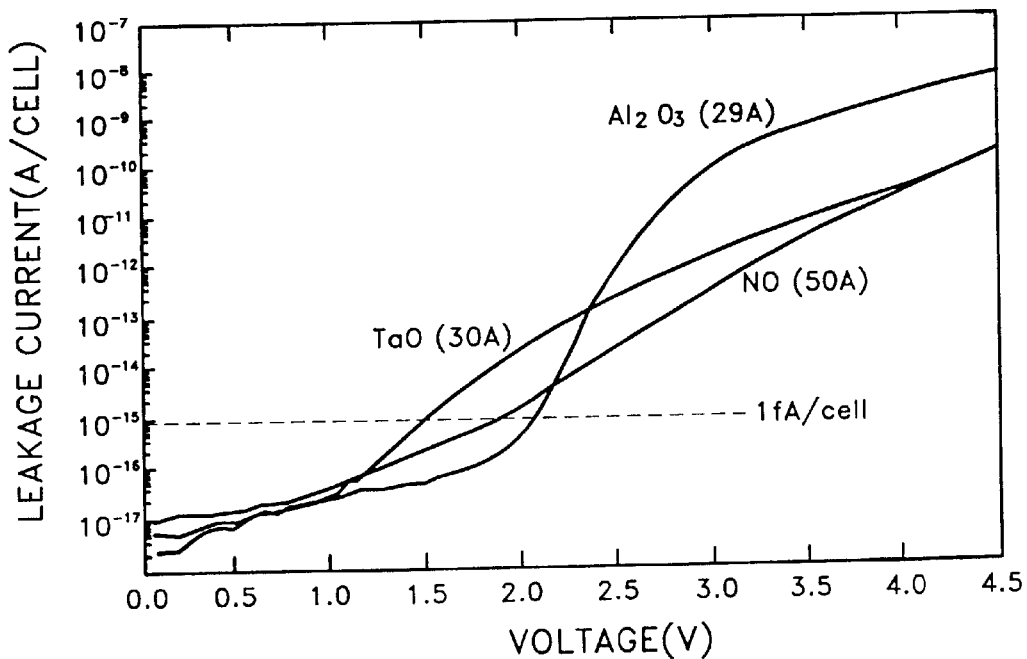
FIG. 20 is a graph for comparing the leakage current characteristic of the MIS capacitor, for which a dielectric film formed by the first preferred embodiment of the present invention is used, with the leakage current characteristic of a conventional capacitor.

FIG. 20 is a graph comparing the leakage current characteristic of the MIS capacitor, for which the dielectric film formed by the first preferred embodiment of the present invention is used, with the leakage current characteristic of the conventional capacitor. The conventional capacitor is the same as the MIS capacitor according to the present invention, excluding that the dielectric film of the conventional capacitor is different from the dielectric film of the MIS capacitor.

As shown in FIG. 20, an applied voltage in the MIS capacitor, for which the aluminum oxide film according to the first preferred embodiment of the present invention is used (shown by the line labeled $Al_2O_3$), is larger than an applied voltage in the conventional capacitor, in which a TaO film or a NO film is used as the dielectric film (shown by the lines labeled TaO and NO, respectively), in the leakage current value of 1 fA per a cell. In other words, the leakage current characteristic of the MIS capacitor according to the first preferred embodiment of the present invention is better, even in a thin equivalent oxide film, than the leakage current characteristic of the conventional capacitor. In FIG. 20, numbers in parentheses denote the thicknesses of the dielectric films.

Figure 21A:
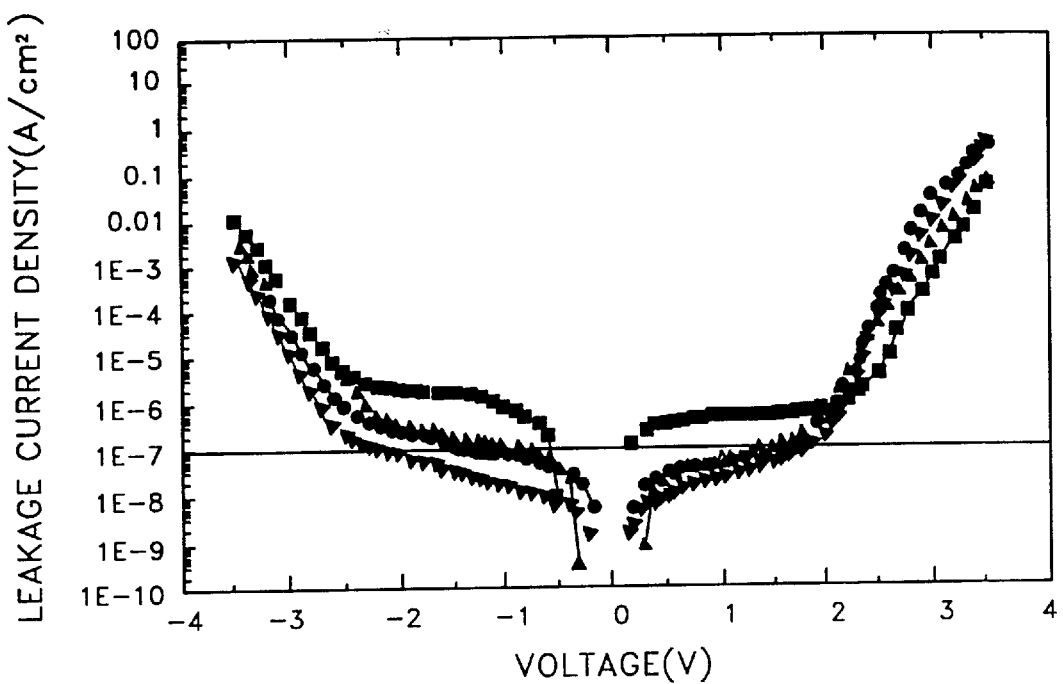
FIGS. 21A and 21B are graphs showing leakage current characteristics according to applied voltage when the aluminum oxide films according to the conventional technology and the first preferred embodiment of the present invention are used as capping films of an MIM capacitor.
Figure 21B:
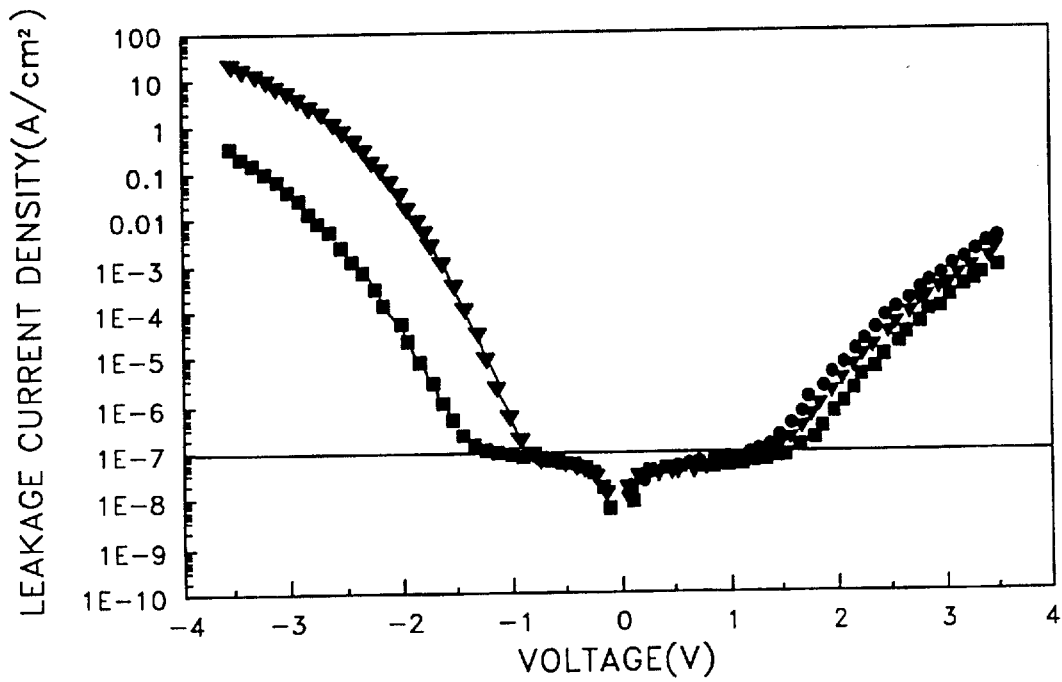

FIGS. 21A and 21B are graphs showing leakage current characteristics according to applied voltage when the aluminum oxide films according to the conventional technology and the first preferred embodiment of the present invention are used as the capping films of an MIM capacitor. In FIGS. 21A and 21B, "■" denotes the MIM capacitor when the capping film is not used.

In FIG. 21A, "●" denotes a case where the aluminum oxide film is formed to be the capping film according to the conventional technology; and "▼" denotes a case where the aluminum oxide film formed to be the capping film is hydrogen annealed at 400° C.

In FIG. 21B, "●" denotes a case where the aluminum oxide film is formed to be the capping film according to the first preferred embodiment of the present invention; "▲" denotes a case where the aluminum oxide film formed to be the capping film is hydrogen annealed at 400° C.; and "▼" denotes a case where the aluminum oxide film formed to be the capping film is nitrogen annealed at 700° C.

In general, when the MIM capacitor is used for a semiconductor device, the dielectric film deteriorates during the hydrogen annealing, which is performed in a successive alloy process. Accordingly, the capping film that operates as a hydrogen barrier is formed on the MIM capacitor. As shown in FIG. 21A, when the aluminum oxide film formed by the first preferred embodiment of the present invention is used as the capping film, the leakage current characteristic does not deteriorate since a barrier characteristic is excellent after the successive hydrogen annealing processes are performed. However, when the aluminum oxide film formed by the conventional technology is used as the capping film, as shown in FIG. 21B, hydrogen from the water vapor and an OH ligand deteriorate the leakage current characteristic of the MIM capacitor during the deposition process.

Second Preferred Embodiment

Figure 22:
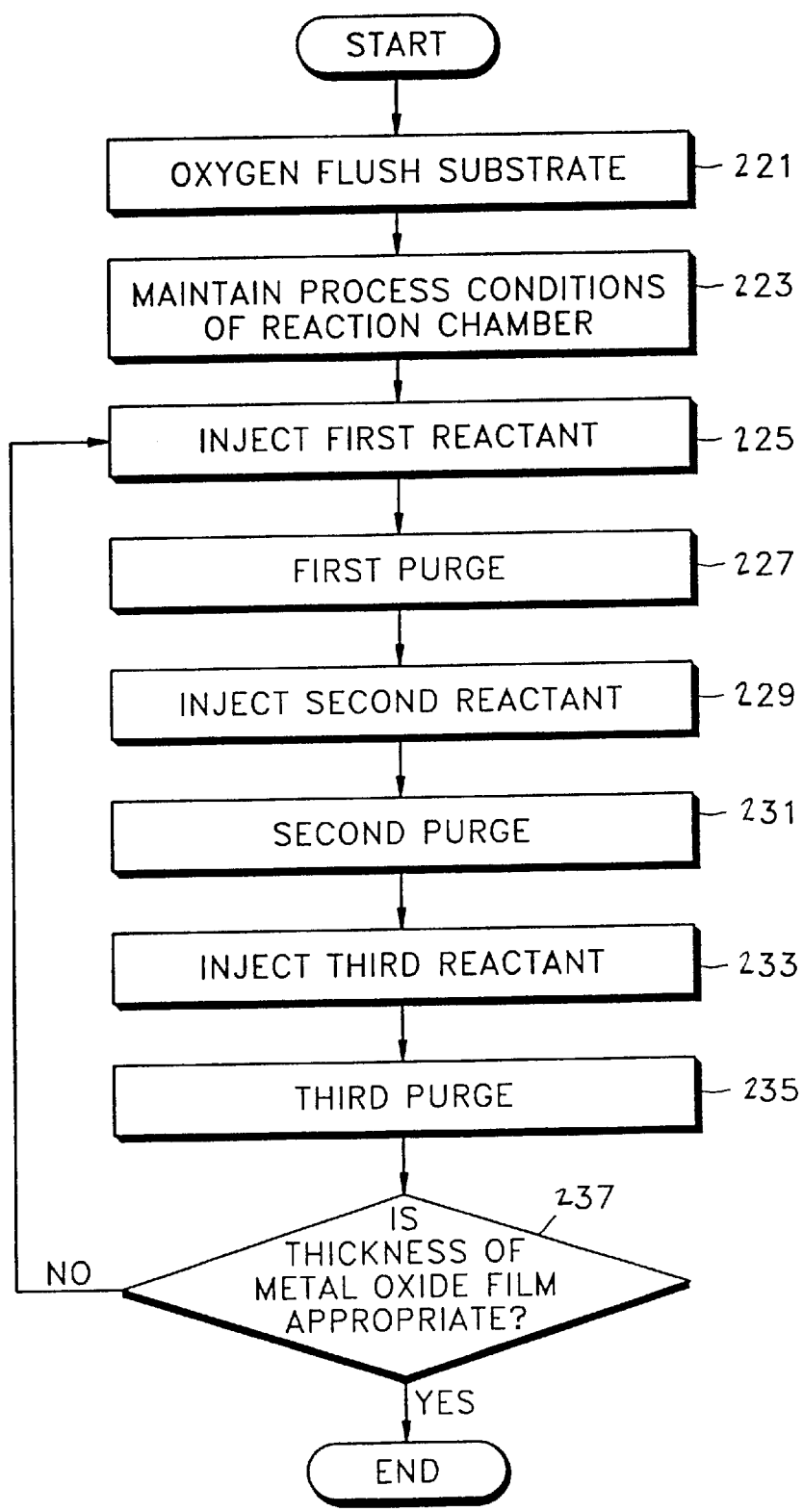
FIG. 22 is a flowchart of a method of forming a thin film using an ALD method according to a second preferred embodiment of the present invention.

FIG. 22 is a flowchart of a second preferred embodiment of the method of forming a thin film using an ALD method according to the present invention. This embodiment is preferably used with the apparatus shown in FIG. 3, and reference will be made below to elements shown in that drawing.

A termination treatment of combining the dangling bond of the substrate 15 with oxygen is performed by oxygen flushing of the substrate 15, e.g., a silicon substrate, with an oxidizing gas (step 221). By this oxygen flushing process, oxygen is bonded to the substrate 15, at any sites where oxygen can be bonded to the substrate 15. The dangling bond can be combined with oxygen, i.e., oxygen can be bonded to available sites on the substrate, not only by performing the oxygen flushing, but also by performing ozone cleaning and forming a silicon oxide film. In alternate embodiments, the oxygen flushing of the substrate 15 may be omitted.

After loading the substrate 15 into the reaction chamber 11, the processing conditions in the reaction chamber are maintained within specific parameters (step 223). In particular, the processing temperature of the reaction chamber 11 is maintained to be preferably between 100 and 400° C., more preferably between 300 and 350° C.; and the processing pressure of the reaction chamber 11 is maintained to be preferably between 1 and 10,000 mTorr, using a heater (not shown). The processing temperature and the processing pressure are preferably maintained in the successive steps, although they can be changed, if necessary.

The first reactant, such as trimethylaluminum ($Al(CH_3)_3$: TMA), is then injected into the reaction chamber 11 through the gas inlet A and the shower head 17 (step 225). This injection is preferably performed for a long enough time to cover the surface of the substrate, for example, between 1 ms and 10 seconds, by opening the first valve $V_1$. During this injection process, the processing temperature and the processing pressure are preferably maintained as above. In this way, the first reactant is chemisorbed onto the oxygen flushed silicon substrate.

The reaction chamber 11 is then purged with an inert gas, such as argon, for between 0.1 and 100 seconds by selectively opening the second valve $V_2$ while the processing temperature and the processing pressure are maintained (step 227). In this way, any portion of the first reactant, that are only physically deposited on the substrate are removed.

The second reactant, e.g., an oxidizing gas that does not contain a hydroxide, is then injected into the reaction chamber 11 through the shower head 17 by opening the third valve $V_3$ while the processing temperature and the processing pressure are maintained (step 229). $N_2O$, $O_2$, $O_3$, or $CO_2$ gas may be used as the second reactant. In this way, the chemisorbed first reactant reacts with the second reactant.

As a result of this process, the first reactant is chemically exchanged to form a metal-oxygen atomic layer film. The second reactant does not fully react with the first reactant. However, it is possible to form the metal-oxygen atomic layer without generating a hydroxide in a metal oxide film as described below.

Unnecessary reactants are then removed by purging the reaction chamber 11 with the inert gas a second time (step 231). Preferably this is done for between 0.1 and 100 seconds, while the processing temperature and the processing pressure are maintained.

The third reactant, e.g., an oxide such as water vapor, is then injected into the reaction chamber 11 through the shower head 17 for a long enough time to cover the surface of the substrate, e.g., between 1 ms and 10 seconds, by opening a fourth valve $V_4$ (step 233). In this way, since the third reactant more actively reacts with the first reactant than the second reactant does, any of the first reactant that did not react with the second reactant will react with the third reactant and be chemically exchanged to further contribute to the formation of the metal-oxygen atomic layer film. At this time, the available amount of the first reactant has been reduced by previously reacting the second reactant, which does not contain a hydroxide, with the first reactant. As a result, a metal oxide film is formed in units of atomic layers in which the generation of a hydroxide is prevented.

In the present preferred embodiment, an aluminum oxide film ($Al_2O_3$) is an example of the metal oxide film. However, a $TiO_2$ film, a $ZrO_2$ film, an $HfO_2$ film, a $Ta_2O_5$ film, an $Nb_2O_5$, film, a $CeO_2$ film, a $Y_2O_3$ film, an $SiO_2$ film, an $In_2O_3$ film, an $RuO_2$ film, an $IrO_2$ film, an $SrTiO_3$ film, a $PbTiO_3$ film, an $SrRuO_3$ film, a $CaRuO_3$ film, a (Ba,Sr)

$TiO_3$ film, a $Pb(Zr,Ti)O_3$ film, a $(Pb,La)(Zr,Ti)O_3$ film, an $(Sr,Ca)RuO_3$ film, a $(Ba,Sr)RuO_3$ film, an $In_2O_3(ITO)$ film doped with Sn, and an $I_2O_3$ film doped with Zr are all other examples of metal oxide films that can be created according to alternate embodiments of the present invention.

Then any unnecessary reactants are removed by purging the reaction chamber 11 with inert gas for between 0.1 seconds and 100 seconds while the processing temperature and pressure are maintained (step 235). This completes the cycle in which the metal oxide film in units of atomic layers is formed. It is possible to prevent the third reactant from reacting with the first reactant to the highest degree by further performing a step of injecting and purging the second reactant, which does not contain a hydroxide, after purging the reaction chamber the third time.

It is then necessary to determine whether the thickness of the metal oxide film formed on the substrate is appropriate, e.g., between 10 Å and 1,000 Å (step 237). If the thickness of the metal oxide film is appropriate, the step of forming the metal oxide film is completed; if the metal oxide film is not thick enough, the steps from the step of injecting the first reactant into the reaction chamber to the step of purging the reaction chamber a third time (steps 225–235) are cyclically repeated as necessary.

Figure 23A:
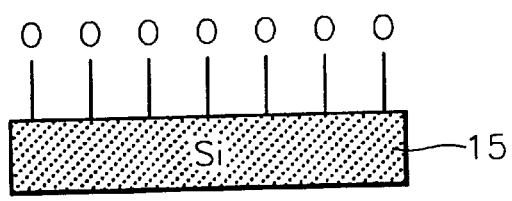
FIGS. 23A through 23D illustrate a combination relationship between reactants adsorbed on a substrate when an aluminum oxide film is formed by a method of forming a thin film using an ALD method according to the second preferred embodiment of the present invention.
Figure 23B:
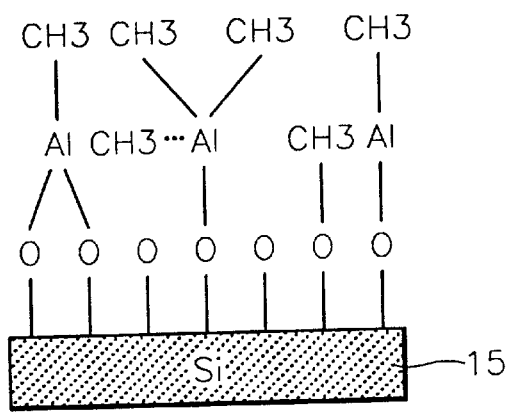

FIGS. 23A through 23D illustrate the combination relationship between reactants adsorbed on a substrate when an aluminum oxide film is formed by a method of forming a thin film using an ALD method according to the second preferred embodiment of the present invention. The substrate 15, e.g., the silicon substrate, is initially flushed with oxygen, thus combining the dangling bond of the substrate 15 with oxygen, as shown in FIG. 23A. In other words, at any sites where oxygen can be bonded to the substrate 15, oxygen is bonded to the surface of the substrate 15 as shown in FIG. 23A. In alternate embodiments, the step of flushing the substrate 15 with oxygen may be omitted.

Trimethylaluminum ($Al(CH_3)_3$), which is the first reactant, is then injected into the reaction chamber, while the processing temperature is maintained to be between 100 and 400° C. and the processing pressure is maintained to be between 1 and 10,000 mTorr. The reaction chamber is then purged with argon gas. By doing this, only amounts of the first reactant that are chemisorbed onto the oxygen flushed substrate remain as shown in FIG. 6. In other words, various forms of chemical bonds such as Si—O, Si—O—$CH_3$, and Si—O—Al—$CH_3$ are formed on the silicon substrate.

The second reactant, which does not include a hydroxide, e.g., $N_2O$, $O_2$, $O_3$, or $CO_2$, is then injected into the reaction chamber 11. For example, when $N_2O$ is used as the second reactant, the reaction proceeds as follows.

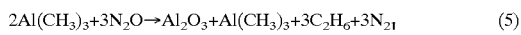

$$2Al(CH_3)_3 + 3N_2O \rightarrow Al_2O_3 + Al(CH_3)_3 + 3C_2H_6 + 3N_2\uparrow \qquad (5)$$

Figure 23C:
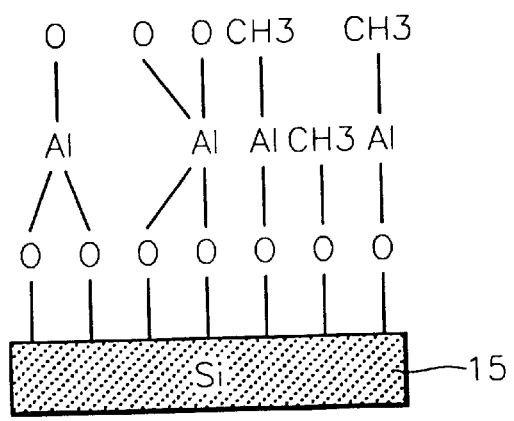

As shown in the chemical formula (5), when $N_2O$, which does not contain a hydroxide, is injected into trimethylaluminum, trimethylaluminum is consumed and $Al_2O_3$ is formed. In other words, the chemisorbed first reactant reacts with the second reactant. Accordingly, the first reactant is chemically exchanged to further contribute to the formation of the metal-oxygen atomic layer film as shown in FIG. 23C. As a result of this, bonds of the form Si—O—Al—O are formed on the silicon substrate.

Figure 23D:
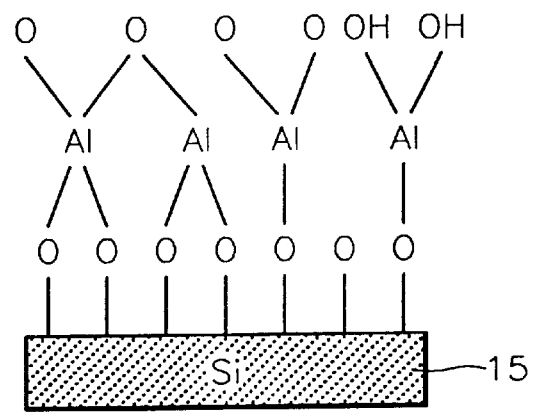

After injecting the third reactant, such as water vapor, into the reaction chamber, the reaction chamber is again purged with argon gas. In this way, any of the first reactant that did not react with the second reactant, reacts with the third reactant and is changed to form the metal-oxygen atomic layer as shown in FIG. 23D. At this time, a metal-oxide film (in which the generation of hydroxide has been inhibited) is formed in units of atomic layers. The generation of hydroxide is inhibited because the available amount of the first reactant is reduced by previously reacting it with the second reactant, which does not include a hydroxide.

The way in which the aluminum oxide film in units of atomic layers, in which the absolute amount of a hydroxide is small, is formed will now be described in detail.

The inventors discovered that the undesired by-product $Al(OH)_3$ is contained in the aluminum oxide film by the reaction represented by chemical formula (2), when the aluminum oxide film is formed by a conventional ALD method. In order to look for the by-product $Al(OH)_3$, the present inventors performed an x-ray photoelectron spectroscopy (XPS) analysis of the aluminum oxide film formed by the conventional ALD method.

Figure 24:
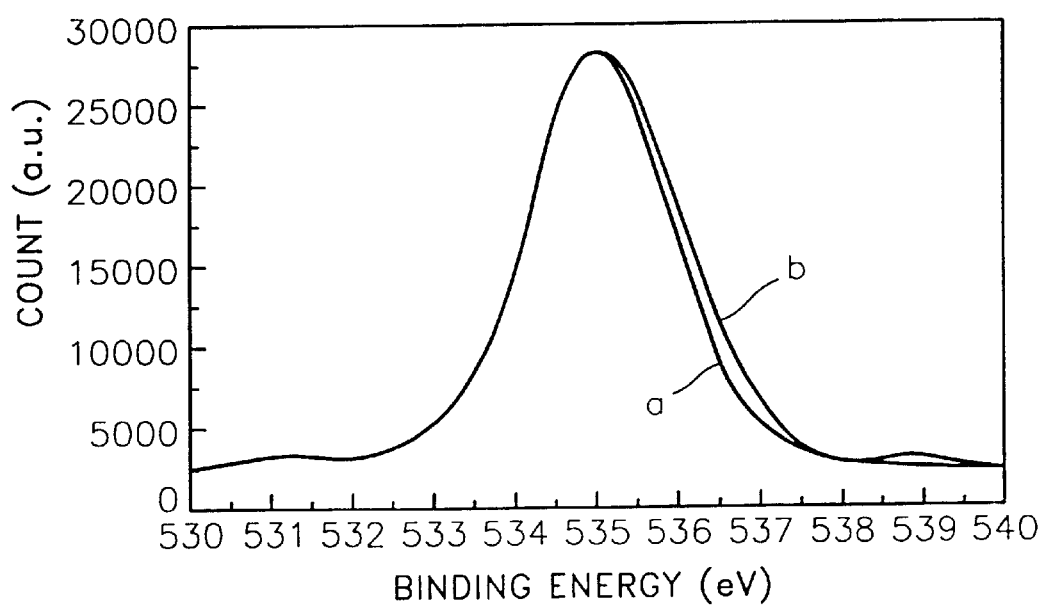
FIG. 24 is an x-ray photoelectron spectroscopy (XPS) graph of the aluminum oxide film formed by a conventional ALD method.

FIG. 24 is an x-ray photoelectron spectroscopy (XPS) graph of an aluminum oxide film formed by the conventional ALD method. In FIG. 24, the x-axis denotes binding energy and the y-axis denotes the electron count in arbitrary units.

As shown in FIG. 24, the right side of the curve (b) is a little wider than the right side of the curve (a) when the curves overlap each other centering around 535.1 eV in the aluminum oxide film peak formed by the conventional ALD method. In other words, the aluminum oxide film formed by the conventional ALD method shows a graph (b) having a width wider than a graph (a) of a pure aluminum oxide film. This is a result of the fact that $Al(OH)_3$ is contained in the film formed by the conventional method.

Considering the above, when trimethylaluminum directly reacts with water vapor like in the conventional technology, a large amount of $Al(OH)_3$, which contains a hydroxide, is created by the reaction represented by chemical formula (2). In order to reduce the amount of $Al(OH)_3$, the absolute amount of the trimethylaluminum that reacts with water vapor must be reduced. In the second preferred embodiment of the present invention, the absolute amount of trimethylaluminum is reduced by reacting trimethylaluminum with $N_2O$, which does not contain hydroxide, and then reacting the remaining un-reacted trimethylaluminum with water vapor. As a result of this, the aluminum oxide film is formed in units of atomic layers with a small absolute amount of a hydroxide.

Figure 25A:
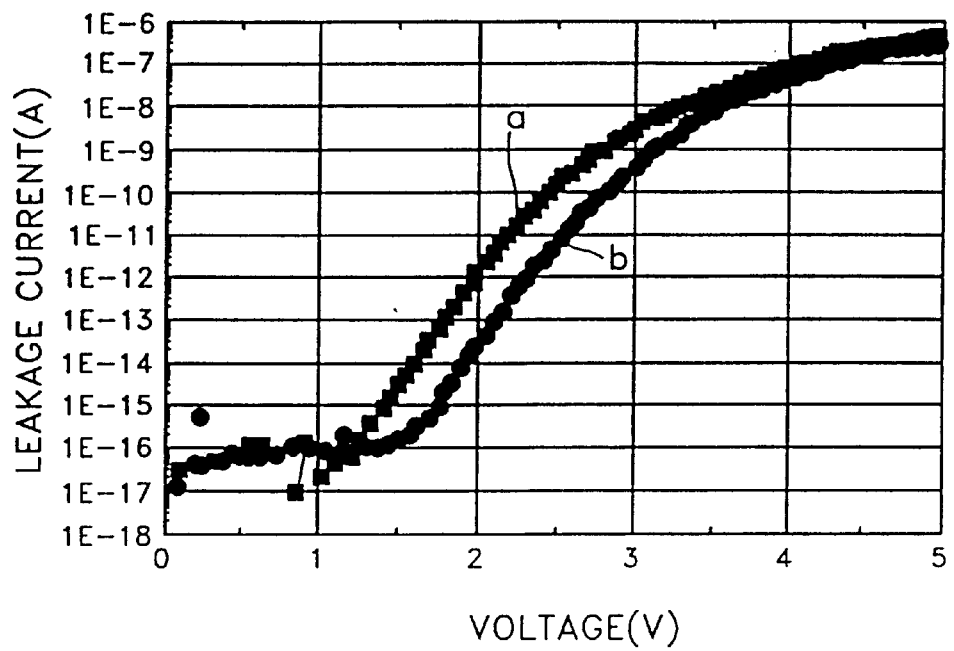
FIGS. 25A and 25B are graphs for showing the leakage current characteristics of aluminum oxide films manufactured by the conventional method and the second preferred embodiment of the present invention, respectively.
Figure 25B:
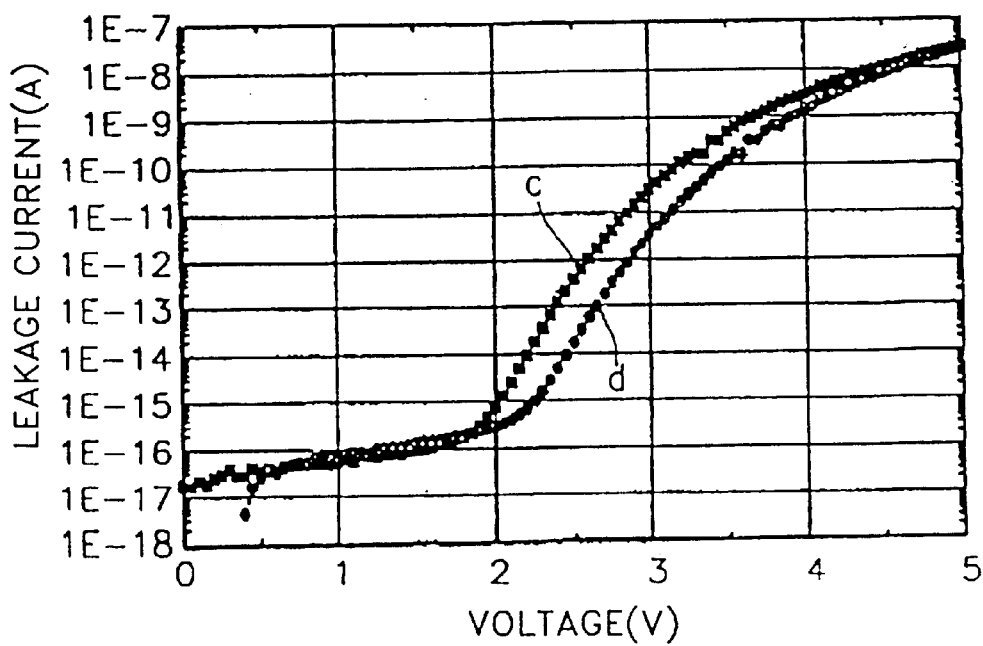

FIGS. 25A and 25B are graphs showing the leakage current characteristics of aluminum oxide films manufactured by the conventional method and the second preferred embodiment of the present invention, respectively. The leakage current characteristics are investigated by applying the aluminum oxide film to a capacitor. A polysilicon film is used as the lower electrode and as the upper electrode of the capacitor. In FIGS. 25A and 25B, curves (a) and (c) denote the results of measuring the amount of current for a cell, that flows through a dielectric film when the lower electrode is connected to ground and a voltage between 0 and 5V is applied to the upper electrode. Curves (b) and (d) denote the results of measuring the amount of current for a cell that flows through the dielectric film under the same conditions that the first measurement was performed under, after the first measurement.

As shown in FIG. 25B, when the aluminum oxide film formed by the present invention is used as the dielectric film, the leakage current is smaller at a given voltage, for example, 2V, as compared with the conventional case of FIG. 25A at the same voltage and the distance between the first curve and the second curve is short. Accordingly, it is noted that leakage current characteristics are improved by the present invention.

Third Preferred Embodiment

Figure 27:
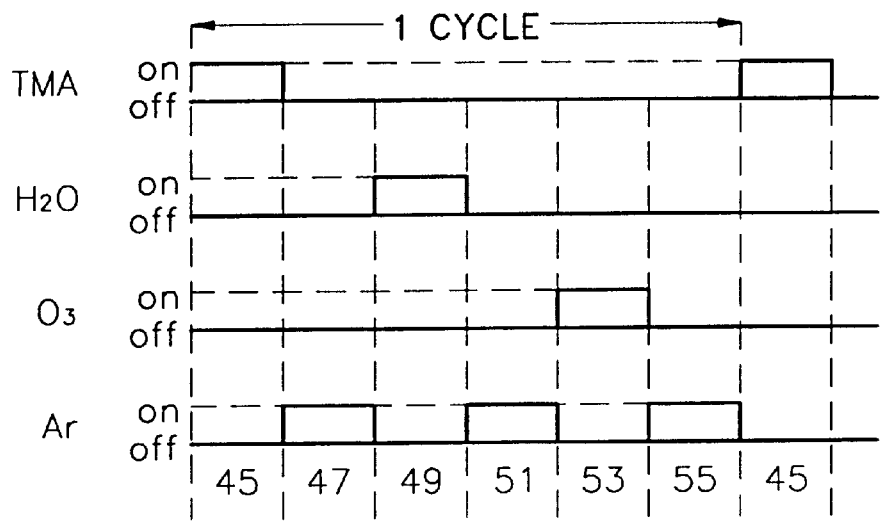
FIG. 27 is a timing diagram showing the supply of reactants during the formation of a thin film using an ALD method according to the third preferred embodiment of the present invention.

FIG. 26 is a flowchart for a method of forming a thin film using an ALD method according to a third preferred embodiment of the present invention. FIG. 27 is a timing diagram showing the supply of reactants during the formation of the thin film using the ALD method according to the third preferred embodiment of the present invention. In the following description, the formation of an aluminum oxide film is taken as an example, although other films could be formed. As with the second preferred embodiment, this preferred embodiment will be described with reference to the apparatus of FIG. 3.

The dangling bond of the substrate 15, e.g., a silicon substrate, is terminated by flushing the substrate 15 with oxygen or nitrogen (step 341). In other words, at any sites where oxygen or nitrogen can be bonded to the substrate 15, oxygen is bonded to the substrate by flushing the substrate 15 with oxygen or nitrogen gas. Although described with reference to the apparatus of FIG. 3, the oxygen or nitrogen flushing can be performed using not only the atomic layer thin film forming apparatus shown in FIG. 3, but also other apparatuses.

Moreover, the dangling bond can be combined with oxygen or nitrogen. In this case, oxygen or nitrogen is bonded to the substrate at any sites where oxygen or nitrogen can be bonded to the substrate, not only by performing the oxygen or nitrogen flushing, but also by performing an ozone cleaning and forming a silicon oxide film and a silicon nitride film. In alternate embodiments, the oxygen or nitrogen flushing may not be necessary.

After loading the substrate 15 into the reaction chamber 11, the processing temperature of the reaction chamber 11 is maintained to be preferably between 100 and 400° C., more preferably between 300 and 350° C., and the processing temperature of the reaction chamber 11 is maintained to be preferably between 1 and 10,000 mTorr using a heater (not shown) and a pump 19 (step 343). The processing conditions are preferably maintained in the successive steps, although, they can be changed, if necessary.

A first reactant, such as trimethylaluminum ($Al(CH_3)_3$: TMA), is injected into the reaction chamber 11 through the gas inlet A and the shower head 17 for a long enough time to cover the surface of the substrate, e.g., between 1 ms and 10 seconds, by opening the first valve $V_1$ (step 345) Preferably the processing conditions are maintained during this step. In this way, the first reactant is chemisorbed onto the oxygen or nitrogen flushed silicon substrate.

The reaction chamber 11 is then purged a first time by an inert gas such as argon, preferably for between 0.1 and 100 seconds, by selectively opening the second valve $V_2$, while the processing conditions are maintained (step 347). In this way, any first reactant that is only physically deposited on the substrate 15 is removed.

A second reactant, e.g., oxidizing gas that has excellent oxidizing power, such as water vapor, is injected into the reaction chamber 11 through the shower head 17 by opening the third valve ($V_3$), while the processing conditions are maintained (step 349). In this way, the chemisorbed first reactant reacts with the second reactant forming a thin film in units of atomic layers, i.e., an aluminum oxide film is formed by chemical exchange.

Thus, the $CH_3$ of TMA reacts with the H of the $H_2O$, thereby forming $CH_4$, which is removed. The Al of the TMA reacts with the O of $H_2O$, thus forming $Al_2O_3$. Since the atomic layer thin film is formed at a temperature of 400° C. or less, which is low, the TMA is not completely decomposed. Accordingly, a large amount of impurities such as carbon or OH form bonds in the aluminum oxide film.

Any second reactant that did not react with the first reactant and is only physisorbed into the substrate 15 is removed by purging the reaction chamber 11 a second time with inert gas such as argon for between 0.1 and 100 seconds, while the processing conditions are maintained (step 351).

A third reactant for removing impurities and improving the stoichiometry of the thin film, e.g., an oxidizing gas such as ozone, is then injected into the reaction chamber through a fourth valve $V_4$ and the shower head 17 for a long enough time to cover the surface of the substrate on which the thin film is formed, for example, between 1ms and 10 seconds (step 353). In this way, it is possible to remove impurities such as carbon or OH that are bonded to and contained in the thin film in units of atomic layers, and to solve the problem that there is a lack of oxygen in the aluminum oxide film. Accordingly, it is possible to obtain a thin film with excellent stoichiometry.

A cycle during which the thin film in units of atomic layers is formed, is completed by purging the reaction chamber 11 a third time with an inert gas for between 0.1 and 100 seconds while the processing conditions are maintained, thus removing any un-reacted physisorbed third reactant (step 355).

It is then necessary to determine whether the thickness of the thin film in units of atomic layers formed on the substrate is appropriate, e.g., between 10 Å and 1,000 Å (step 357). If the thickness of the thin film is appropriate, the process of forming the thin film is completed. If, however, the thin film is not thick enough, the steps, from the step of injecting the first reactant (step 45) to the step of purging the reaction chamber a third time (step 55), are cyclically repeated as necessary.

In the present preferred embodiment, the aluminum oxide film is formed using trimethylaluminum ($Al(CH_3)_3$: TMA) as the first reactant, water vapor, which is an oxide gas, as the second reactant, and ozone gas for removing the impurities as the third reactant. However, it is possible to form a titanium nitride film using $TiCl_4$ as the first reactant, $NH_3$ as the second reactant, and nitrogen gas for removing impurities and improving the stoichiometry of the thin film as the third reactant. Other alternate choices are also available.

Furthermore, according to the method of forming an atomic layer thin film of the third preferred embodiment of the present invention, it is possible to form a single atomic oxide, a composite oxide, a single atomic nitride, or a composite nitride other than an aluminum oxide film or a titanium nitride film. $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$ are examples of single atomic oxides. $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $In_2O_3$ doped with Sn, $In_2O_3$ doped with Fe, and $In_2O_3$ doped with Zr are examples of composite oxides. SiN, NbN, ZrN, TiN, TaN, $Ya_3N_5$, AlN, GaN, WN, and BN are examples of single atomic nitrides. WBN, WSiN, TiSiN, TaSiN, AlSiN, and AlTiN are examples of composite nitrides.

A thin film formed by the method of forming a thin film using the ALD method according to the third preferred embodiment of the present invention can be applied to semiconductor devices. For example, the thin film can be used as a gate oxide layer, the electrode of a capacitor, an etching stopping film, a capping film for preventing reaction, an anti-reflection film during a photolithography process, a barrier metal film, a selective deposition film, or a metal gate electrode.

Figure 28:
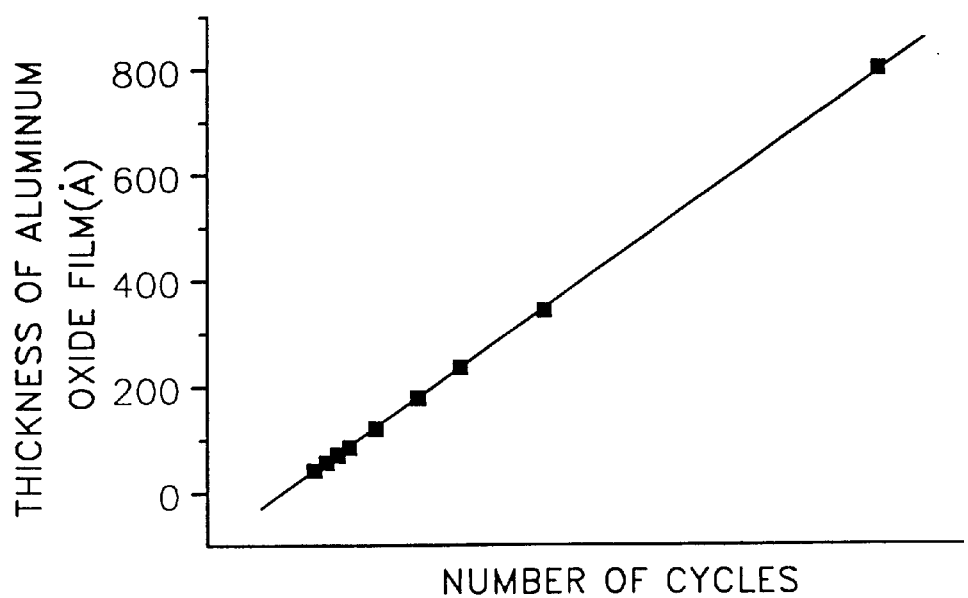
FIG. 28 is a graph showing the thickness of an aluminum oxide film manufactured by the method of forming an atomic layer thin film according to the third preferred embodiment of the present invention as a function of the number of times the steps of the method are repeated.

FIG. 28 is a graph showing the thickness of an aluminum oxide film manufactured by the method of forming an atomic layer thin film according to the third preferred embodiment of the present invention as a function of the number of times the steps of the method are repeated, i.e., the number of cycles performed. One cycle includes the steps of injecting the first reactant into the reaction chamber, purging the reaction chamber of the physisorbed first reactant, injecting the second reactant into the reaction chamber, purging the reaction chamber of the physisorbed second reactant, injecting the third reactant into the reaction chamber, and purging the reaction chamber of the physisorbed third reactant.

As shown in FIG. 28, according to the thin film manufacturing method of the third preferred embodiment of the present invention, since the aluminum oxide film is grown to a thickness of 1.1 Å each cycle and the thickness of the aluminum oxide film linearly increases in proportion to the number of cycles, the aluminum oxide film is easily formed by the atomic layer deposition method of the present invention.

Figure 29:
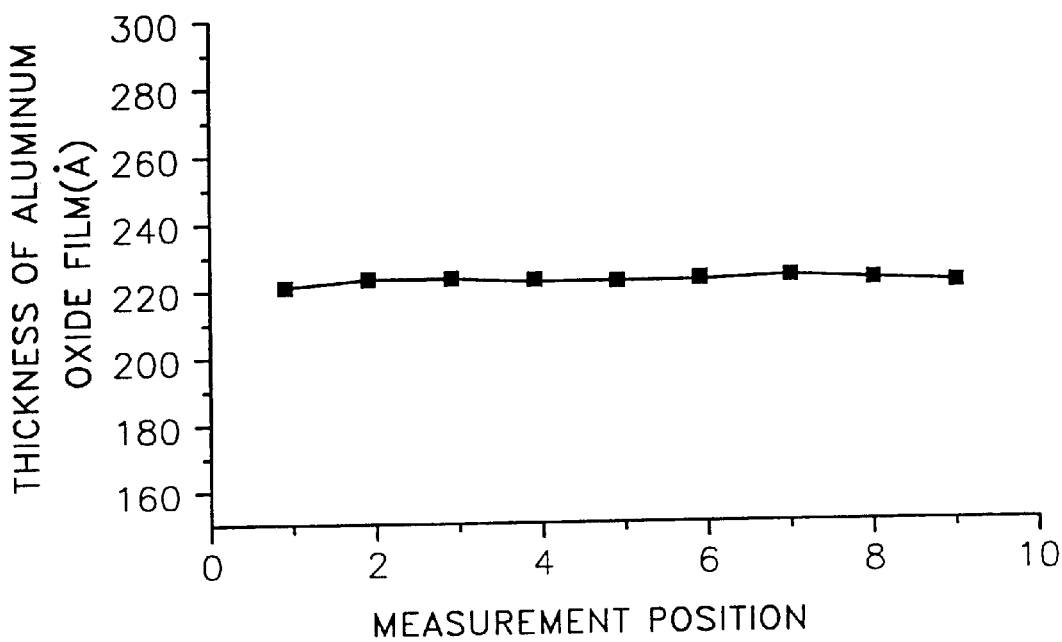
FIG. 29 is a graph showing the uniformity of an aluminum oxide film manufactured by the method of forming an atomic layer thin film according to the third preferred embodiment of the present invention.

FIG. 29 is a graph illustrating the uniformity of an aluminum oxide film manufactured by the method of forming an atomic layer thin film according to the third preferred embodiment of the present invention. The x-axis denotes the positions of nine points: the central point of an eight-inch substrate, four points separated by 90° on the circumference of a circle having a diameter of 1.75 inches, and another four points spaced apart by 90° on the circumference of a circle having a diameter of 3.5 inches. The y-axis denotes the thickness of the aluminum oxide film. As shown in FIG. 29, the uniformity of the aluminum oxide film is excellent over the eight-inch substrate.

Figure 30A:
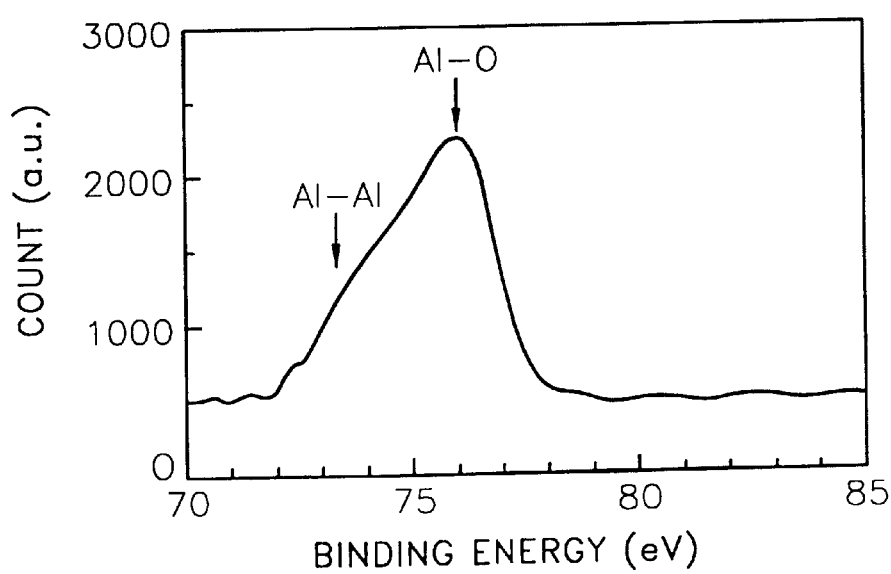
FIGS. 30A and 30B are graphs analyzing the aluminum peaks of aluminum oxide films manufactured by the conventional technology and the method of forming an atomic layer thin film according to the third preferred embodiment of the present invention, respectively, using XPS.
Figure 30B:
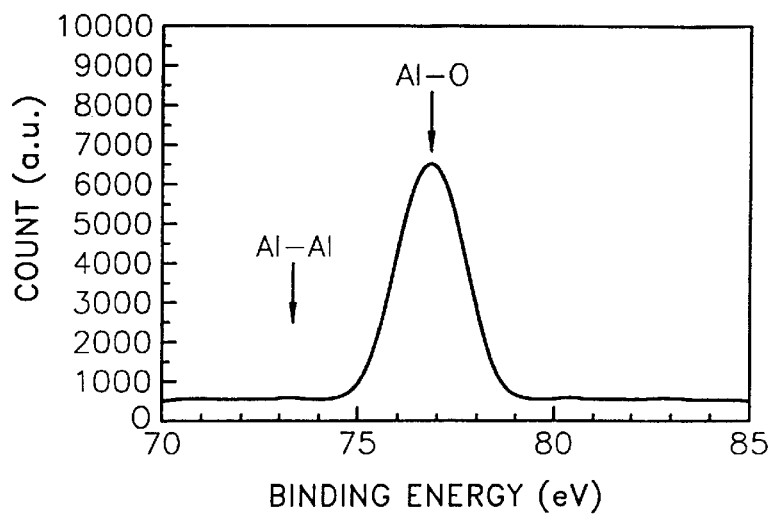

FIGS. 30A and 30B are graphs analyzing the aluminum peaks of aluminum oxide films manufactured by the conventional technology and the method of forming an atomic layer thin film according to the third preferred embodiment of the present invention, respectively, using XPS. In particular, the x-axis denotes the binding energy and the y-axis denotes the electron count.

In the conventional aluminum oxide film, a large amount of Al—Al bonding occurs as shown in FIG. 30A. In contrast, however, in the aluminum oxide film according to the third preferred embodiment of the present invention, almost no Al—Al bonding occurs and Al—O bonding is most prominent, as shown in FIG. 30B. Accordingly, it is noted that the stoichiometry of the aluminum oxide film according to the third preferred embodiment of the present invention is excellent.

Figure 31A:
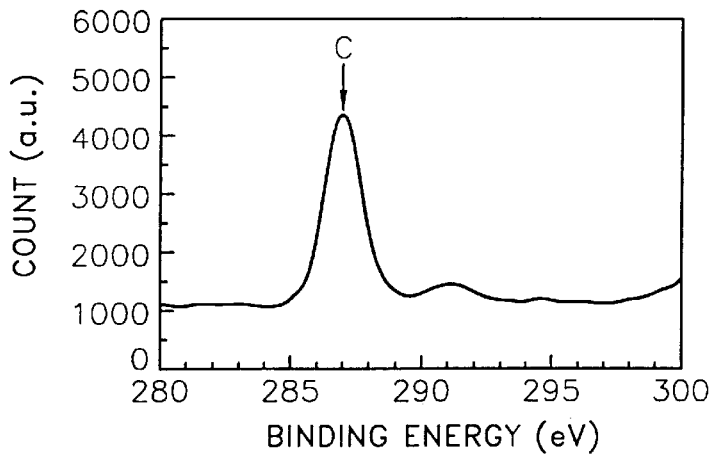
FIGS. 31A and 31B are graphs analyzing the carbon peaks of aluminum oxide films manufactured by the conventional technology and the method of forming a thin film using an ALD method according to the third preferred embodiment of the present invention, respectively, using XPS.
Figure 31B:
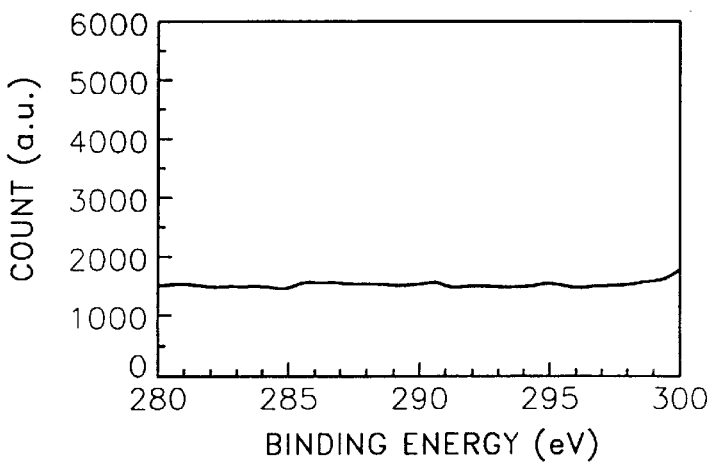

FIGS. 31A and 31B are graphs analyzing the carbon peaks of aluminum oxide films manufactured by the conventional technology and the method of forming a thin film using the ALD method according to the third preferred embodiment of the present invention, respectively, using XPS. In particular, the x-axis denotes the binding energy and the y-axis denotes the electron count.

As shown in FIG. 31A, in the conventional aluminum oxide film, a carbon peak occurs. This means that a large amount of carbon is contained in the aluminum oxide film. As shown in FIG. 31B, however, in the aluminum oxide film according to the third preferred embodiment of the present invention, no carbon peak is shown in FIG. 31B. As a result of this, it is possible to obtain an aluminum oxide film in which impurities such as carbon are reduced by using the third preferred embodiment of the present invention.

Fourth Preferred Embodiment

Figure 32:
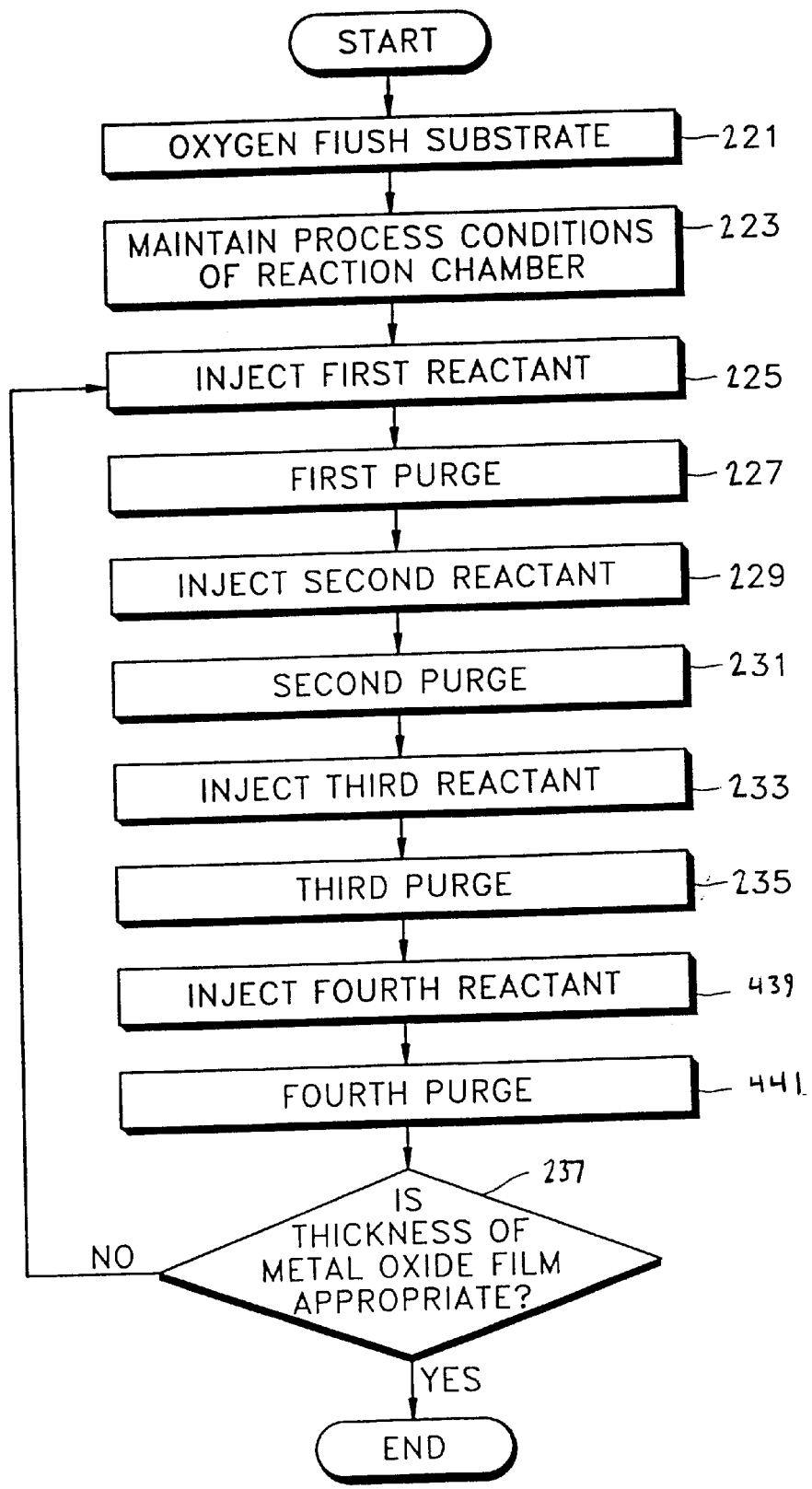
FIG. 32 is a flowchart of a method of forming an atomic layer thin film according to a fourth preferred embodiment of the present invention.

FIG. 32 is a flowchart for a method of forming an atomic layer thin film according to a fourth preferred embodiment of the present invention. In FIG. 32, the reference numerals that are identical to those of FIG. 22 correspond to those steps. The fourth preferred embodiment will also be described with reference to the apparatus of FIG. 3.

The fourth preferred embodiment of the present invention is a combination of the second preferred embodiment and the third preferred embodiment. Specifically, the fourth preferred embodiment is the same as the second and third preferred embodiments except that the reaction chamber is purged a fourth time (step 441) after injecting a fourth reactant (step 439). In this preferred embodiment, this is performed by introducing an oxidizing gas such as ozone gas into the reaction chamber through the third valve $V_3$ and the shower head 17 for a long enough time to cover the surface of the substrate on which the thin film is formed, e.g., between 1 ms and 10 seconds (step 439). The ozone gas acts to remove impurities and improve the stoichiometry of the thin film. This fourth injection and fourth purge is preferably performed after the third purge (step 235).

In this way, it is possible to remove impurities such as bonded carbon or OH bonds, that are contained in the metal oxide film in units of atomic layers, and to solve the problem that oxygen is lacking in the metal oxide film. As a result, this method can obtain a highly pure, thin film. Thus, according to the present invention, it is possible to obtain a thin film of desired quality and to minimize the density of the impurities by increasing the probability that the main reactants react with each other before or after injecting them. As a result, impurities of the thin film other than the main reactants may be removed and the quality of the thin film may be improved through a complete reaction, in forming a thin film by an atomic layer deposition (ALD) method according to the fourth preferred embodiment of the present invention.

As mentioned above, in the method of forming a thin film using an ALD method according to preferred embodiments of the present invention, the ligand of the first reactant A is separated due to a difference in binding energy, without the movement of a radical from the second reactant B to the first reactant A. A volatile vapor phase material is thus formed by the combination of ligands and the vapor phase material is removed by purging. As a result, according to the method of forming a thin film using an ALD method of the preferred embodiments of the present invention, it is possible to reduce the impurities generated in a thin film by sub-reactions, since the movement of the radical does not occur.

In the method of forming a thin metal oxide film using an ALD method according to another embodiment of the present invention, it is possible to prevent the generation of by-products such as hydroxide in the metal oxide film by reducing the absolute amount of the first reactant by previously reacting the first reactant with a second reactant that does not contain hydroxide, and then reacting the first reactant with a third reactant which contains a hydroxide. For example, it is possible to form an aluminum oxide film in which the absolute amount of hydroxide is small by reducing the absolute amount of trimethylaluminum by previously reacting trimethylaluminum with $N_2O$, which does not contain a hydroxide, and then reacting trimethylaluminum with water vapor.

Also, in the method of forming a thin film using an ALD method according to another embodiment of the present invention, a third reactant for removing the impurities and improving the stoichiometry of the thin film is injected into the reaction chamber and the reaction chamber is purged of the third reactant, when the atomic layer deposition method is used. In this way, it is possible to obtain a thin film with excellent stoichiometry, and which does not contain impurities.

The present invention has been described by way of specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method of forming a thin film over a substrate using atomic layer deposition (ALD), comprising:
    placing the substrate into a reaction chamber;
    injecting a first reactant into the reaction chamber so that a portion of the first reactant is chemisorbed onto the substrate, the first reactant including a thin film atom and a ligand;
    purging the reaction chamber with a first inert gas to remove any of the first reactant that is only physisorbed onto the substrate;
    injecting a second reactant into the reaction chamber to form the thin film in atomic layers by a chemical reaction between the thin film atom and the second reactant, and to remove the ligand without generating by-products; and
    purging the reaction chamber with a second inert gas, after injecting the second reactant, to remove any of the second reactant that is physisorbed onto the substrate,
    wherein the binding energy of the second reactant with respect to the thin film atom is larger than the binding energy of the ligand with respect to the thin film atom.

2. A method of forming a thin film, as recited in claim 1, wherein the first reactant comprises $Al(CH_3)_3$ and the second reactant comprises an activated oxidizing agent.

3. A method of forming a thin film, as recited in claim 1, wherein the first and second inert gases are the same.

4. A method of forming a thin film, as recited in claim 1, wherein the injecting of the first reactant into the reaction chamber, the purging of the reaction chamber with a first inert gas, the injecting of the second reactant into the reaction chamber, and the purging of the reaction chamber with a second inert gas, are repeated a plurality of times.

5. A method of forming a thin film using an ALD method, comprising:
    placing a substrate into a reaction chamber;
    injecting a first reactant into the reaction chamber so that a portion of the first reactant is chemically adsorbed onto the substrate;
    purging the reaction chamber with a first inert gas to remove any first reactant that is only physisorbed over the substrate;
    injecting a second reactant into the reaction chamber to chemically exchange a first portion of the chemisorbed first reactant and to form a metal-oxygen atomic layer film;
    purging the reaction chamber with a second inert gas to remove any of the second reactant that is physisorbed over the substrate; and
    injecting a third reactant into the reaction chamber to form a metal oxide film in units of atomic layers by chemically exchanging a second portion of the chemisorbed first reactant,
    wherein the second reactant does not contain a hydroxide.

6. A method of forming a thin film, as recited in claim 5, wherein the injecting of the third reactant into the reaction chamber operates to prevent the generation of hydroxide.

7. A method of forming a thin film, as recited in claim 5, wherein the first reactant is a metal reactant, the second reactant is $N_2O$, $O_2$, $O_3$, or $CO_2$, and the third reactant is an oxidizing gas.

8. A method of forming a thin film, as recited in claim 5, wherein the temperature of the reaction chamber is maintained to be between 100 and 400° C. from the injecting the first reactant to the injecting the third reactant.

9. A method of forming a thin film, as recited in claim 5, wherein the metal oxide film comprises a material selected from the group consisting of an $Al_2O_3$ film, a $TiO_2$ film, a $ZrO_2$ film, an $HfO_2$ film, a $Ta_2O_5$ film, an $Nb_2O_5$ film, a $CeO_2$ film, a $Y_2O_3$ film, an $SiO_2$ film, an $In_2O_3$ film, an $RuO_2$ film, an $IrO_2$ film, an $SrTiO_3$ film, a $PbTiO_3$ film, an $SrRuO_3$ film, a $CaRuO_3$ film, a $(Ba,Sr)TiO_3$ film, a $Pb(Zr,Ti)O_3$ film, a $(Pb,La)(Zr,Ti)O_3$ film, an $(Sr,Ca)RuO_3$ film, a $(Ba,Sr)RuO_3$ film, an $In_2O_3$(ITO) film doped with Sn, and an $I_2O_3$ film doped with Zr.

10. A method of forming a thin film, as recited in claim 5,
    wherein a dangling bond on a surface of the substrate is terminated by injecting an oxidizing gas into the reaction chamber before injecting the first reactant, and
    wherein the substrate is a silicon substrate.

11. A method of forming a thin film, as recited in claim 5, further comprising purging the reaction chamber with a third inert gas after injecting the third reactant into the reaction chamber, to remove any of the third reactant physisorbed over the substrate.

12. A method of forming a thin film, as recited in claim 11, wherein the first, second, and third inert gases are the same.

13. A method of forming a thin film, as recited in claim 11, wherein the injecting of the first reactant into the reaction chamber, the purging of the reaction chamber with the first inert gas, the injecting of the second reactant into the reaction chamber, the purging of the reaction chamber with the second inert gas, the injecting of the third reactant into the reaction chamber, and the purging of the reaction chamber with the third inert gas, are repeated a plurality of times.

14. A method of forming a thin film, as recited in claim 11, further comprising injecting a fourth reactant into the reaction chamber, after purging of the reaction chamber with the third inert gas, to remove any impurities and to improve the stoichiometry of the metal oxide film.

15. A method of forming a thin film, as recited in claim 14, wherein the fourth reactant is ozone gas.

16. A method of forming a thin film, as recited in claim 11, wherein the first, second, and third inert gases are the same.

17. A method of forming a thin film, as recited in claim 16, wherein the from the injecting of the first reactant into the reaction chamber, the purging of the reaction chamber with the first purge gas, the injecting of the second reactant into the reaction chamber, the purging of the reaction chamber with the second purge gas, the injecting of the third reactant into the reaction chamber, the purging of the reaction chamber with the third purge gas, are repeated a plurality of times.

18. A method of forming a thin film using an ALD method, comprising:

loading a substrate into a reaction chamber;

injecting a first reactant into the reaction chamber so that a portion of the first reactant is chemically adsorbed into the substrate;

purging the reaction chamber with a first inert gas to remove any of the first reactant that is only physisorbed over the substrate;

injecting a second reactant into the reaction chamber to form the thin film in units of atomic layers by chemically exchanging the first reactant to further contribute to the formation of the second reactant;

purging the reaction chamber with a second inert gas to remove any of the second reactant that is physisorbed over the substrate; and injecting a third reactant into the reaction chamber to remove impurities and improving the stoichiometry of the thin film.

19. A method of forming a thin film, as recited in claim 18, wherein the first reactant comprises a metal reactant and the second and third reactants comprise oxidizing gases.

20. A method of forming a thin film, as recited in claim 18, wherein the thin film comprises a metal oxide film formed of a single atomic oxide or a composite oxide.

21. A method of forming a thin film, as recited in claim 20, wherein the single atomic oxide comprises a material selected from the group consisting of $Al_2O_3$, $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$.

22. A method of forming a thin film, as recited in claim 20, wherein the composite oxide comprises a material selected from the group consisting of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $In_2O_3$ doped with Sn, $In_2O_3$ doped with Fe, and $In_2O_3$ doped with Zr.

23. A method of forming a thin film, as recited in claim 18, wherein the first reactant is a metal reactant and the second and third reactants are nitriding gases.

24. A method of forming a thin film, as recited in claim 18, wherein the thin film comprises a metal nitride film formed of a single atomic nitride or a composite nitride.

25. A method of forming a thin film, as recited in claim 24, wherein the single atomic nitride comprises a material selected from the group consisting of SiN, NbN, ZrN, TiN, TaN, $Ya_3N_5$, AlN, GaN, WN, and BN.

26. A method of forming a thin film, as recited in claim 24, wherein the composite nitride comprises a material selected from the group consisting of WBN, WSiN, TiSiN, TaSiN, AlSiN, and AlTiN.

27. A method of forming a thin film, as recited in claim 18, further comprising purging the reaction chamber with a third inert gas, after injecting the third reactant, to remove any of the third reactant that is physisorbed over the substrate.

28. A method of forming a thin film, as recited in claim 18,
wherein a dangling bond on a surface of the substrate is terminated by injecting oxidizing gas or nitriding gas into the reaction chamber before injecting the first reactant, and
wherein the substrate is a silicon substrate.

29. A method of forming a thin film, as recited in claim 18, wherein the temperature of the reaction chamber is maintained to be between 100 and 400° C. from the injecting of the first reactant to the injecting of the third reactant.

30. A method of forming a thin film over a substrate using atomic layer deposition (ALD), comprising:

placing the substrate into a reaction chamber;

injecting a first reactant into the reaction chamber so that a portion of the first reactant is chemisorbed onto the substrate, the first reactant including a thin film atom and a ligand;

purging the reaction chamber with a first inert gas to remove any of the first reactant that is only physisorbed onto the substrate; and injecting a second reactant, comprising an activated oxidizing agent, into the reaction chamber to form the thin film in atomic layers by a chemical reaction between the thin film atom and the second reactant, and to remove the ligand without generating by-products, wherein the activated oxidizing agent comprises $O_3$ and the binding energy of the second reactant with respect to the thin film atom is larger than the binding energy of the ligand with respect to the thin film atom.

31. A method of forming a thin film over a substrate using atomic layer deposition (ALD), comprising:

placing the substrate into a reaction chamber;

injecting a first reactant into the reaction chamber so that a portion of the first reactant is chemisorbed onto the substrate, the first reactant including a thin film atom and a ligand;

purging the reaction chamber with a first inert gas to remove any of the first reactant that is only physisorbed onto the substrate;

injecting a second reactant into the reaction chamber to form the thin film in atomic layers by a chemical reaction between the thin film atom and the second reactant, and to remove the ligand without generating by-products; and purging the reaction chamber with a second inert gas, after injecting the second reactant, to remove any of the second reactant that is physisorbed onto the substrate, wherein the binding energy of the second reactant with respect to the thin film atom is larger than the binding energy of the ligand with respect to the thin film atom, wherein the first reactant comprises $Al(CH_3)_3$ and the second reactant comprises an activated oxidizing agent, and wherein the activated oxidizing agent comprises a material selected from the group consisting of $O_3$, $O_2$ plasma, and $N_2O$ plasma.

32. A method of forming a thin film over a substrate using atomic layer deposition (ALD), comprising:

placing the substrate into a reaction chamber;

injecting a first reactant, comprising $Al(CH_3)_3$, into the reaction chamber so that a portion of the first reactant is chemisorbed onto the substrate, the first reactant including a thin film atom and a ligand;

purging the reaction chamber with a first inert gas to remove any of the first reactant that is only physisorbed onto the substrate; and injecting a second reactant, comprising an activated oxidizing agent, into the reaction chamber to form the thin film in atomic layers by a chemical reaction between the thin film atom and the second reactant, and to remove the ligand without generating by-products, wherein the activated oxidizing agent comprises $O_3$ and the binding energy of the second reactant with respect to the thin film atom is larger than the binding energy of the ligand with respect to the thin film atom.

* * * * *